(12) United States Patent
Oie et al.

(10) Patent No.: US 12,342,471 B2
(45) Date of Patent: Jun. 24, 2025

(54) ELECTRONIC COMPONENT AND METHOD FOR MANUFACTURING ELECTRONIC COMPONENT

(71) Applicant: Murata Manufacturing Co., Ltd., Kyoto (JP)

(72) Inventors: Hirofumi Oie, Kyoto (JP); Toru Yaso, Kyoto (JP); Kiyohiro Kashiuchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 89 days.

(21) Appl. No.: 18/067,042

(22) Filed: Dec. 16, 2022

(65) Prior Publication Data

US 2023/0119828 A1  Apr. 20, 2023

Related U.S. Application Data

(63) Continuation of application No. PCT/JP2021/023210, filed on Jun. 18, 2021.

(30) Foreign Application Priority Data

Jun. 18, 2020  (JP) .................................. 2020-105360

(51) Int. Cl.
*B32B 3/10* (2006.01)
*H01L 23/15* (2006.01)
(Continued)

(52) U.S. Cl.
CPC ............. *H05K 3/246* (2013.01); *H01L 23/15* (2013.01); *H05K 1/05* (2013.01); *H05K 3/12* (2013.01); *H05K 3/4629* (2013.01)

(58) Field of Classification Search
None
See application file for complete search history.

(56) References Cited

U.S. PATENT DOCUMENTS

| 2004/0099364 A1 | 5/2004 | Suzuki et al. |
| 2008/0203564 A1* | 8/2008 | Motoyoshi ............. H01L 24/83 438/117 |
| 2014/0057080 A1 | 2/2014 | Iwakoshi et al. |

FOREIGN PATENT DOCUMENTS

| JP | H09-293956 A | 11/1997 |
| JP | 2004-343028 A | 12/2004 |

(Continued)

OTHER PUBLICATIONS

Machine translation of JP-3994936-B2 (Year: 2007).*
International Search Report for PCT/JP2021/023210 dated Aug. 31, 2021.

*Primary Examiner* — Christopher M Polley
(74) *Attorney, Agent, or Firm* — McDonald Hopkins LLC

(57) ABSTRACT

An electronic component of the present disclosure includes: an electronic component body; an electrode on a surface of the electronic component body; and a cover layer having insulating properties on at least a portion of a perimeter of the electrode and extending across a boundary between the perimeter of the electrode and the surface of the electronic component body, wherein in a plan view of the electronic component body seen from a side where the electrode is disposed, the electrode includes corners each provided by two segments defining a portion of the perimeter of the electrode, and a thickness of at least a portion of the cover layer on at least one of the corners is greater than a thickness of the other portions of the cover layer on portions other than the corners.

17 Claims, 22 Drawing Sheets

(51) Int. Cl.
*H05K 1/05* (2006.01)
*H05K 3/12* (2006.01)
*H05K 3/24* (2006.01)
*H05K 3/46* (2006.01)

(56) References Cited

FOREIGN PATENT DOCUMENTS

| | | | |
|---|---|---|---|
| JP | 2005-286303 A | 10/2005 | |
| JP | 3994936 B2 * | 10/2007 | ....... H01L 23/49822 |
| JP | 2008-210827 A | 9/2008 | |
| JP | 2012-164784 A | 8/2012 | |
| WO | 2012/157436 A1 | 11/2012 | |

* cited by examiner

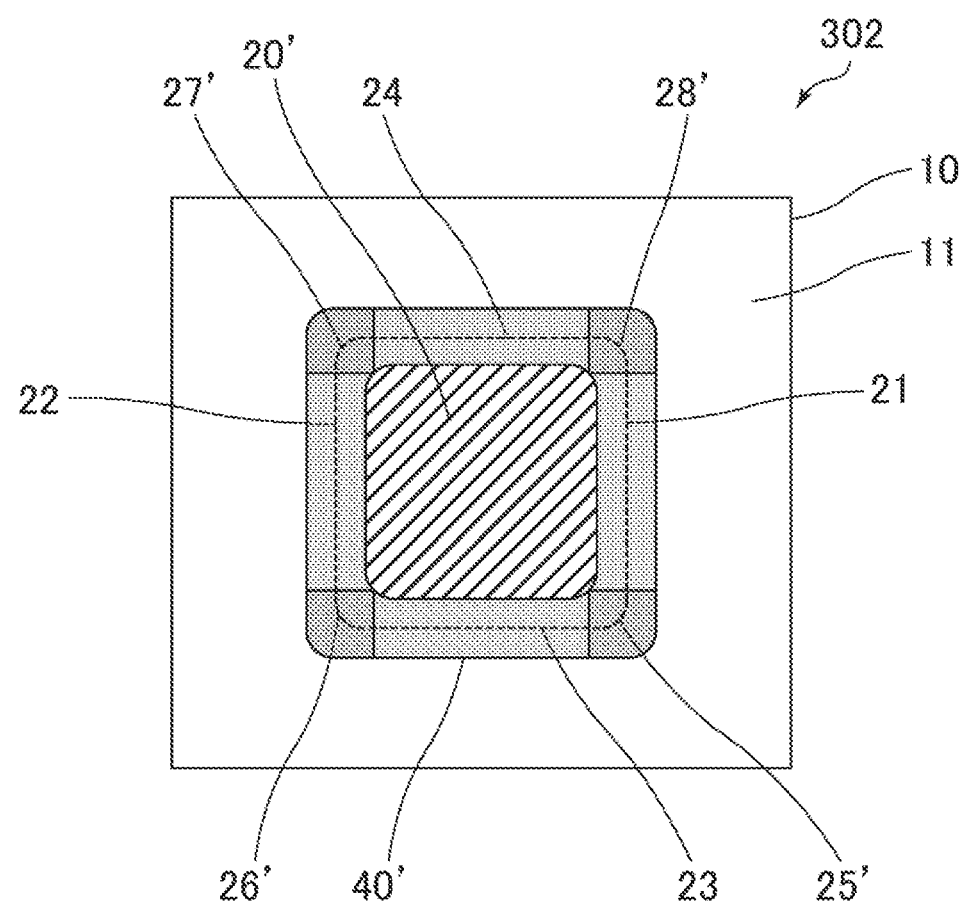

ELECTRONIC COMPONENT AND METHOD FOR MANUFACTURING ELECTRONIC COMPONENT

CROSS REFERENCE TO RELATED APPLICATION

This is a continuation of International Application No. PCT/JP2021/023210 filed on Jun. 18, 2021 which claims priority from Japanese Patent Application No. 2020-105360 filed on Jun. 18, 2020. The contents of these applications are incorporated herein by reference in their entireties.

BACKGROUND OF THE DISCLOSURE

Field of the Disclosure

The present disclosure relates to an electronic component and a method of producing an electronic component.

Description of the Related Art

A known example of a multilayer ceramic electronic component to be mounted on a mounting substrate is a multilayer ceramic substrate having a structure in which an external terminal electrode is disposed along a main surface of a component body including a stack of multiple ceramic layers.

For example, Patent Literature 1 discloses a multilayer ceramic electronic component to be mounted on a mounting substrate, including: a component body including a stack of multiple ceramic layers; an inner conductor inside the component body; an external terminal electrode obtained by baking a conductive paste on a first main surface of the component body and electrically connected to the mounting substrate, the first main surface extending in a direction in which the ceramic layers extend; an exposed portion exposed at the first main surface; and an embedded portion extending in an embedded manner inside the component body in at least a portion of a periphery of the exposed portion, wherein a ceramic composition in a covering ceramic layer (insulating cover layer) covering the embedded portion and exposed at the first main surface is different from a ceramic composition in a base ceramic layer defining the component body excluding the covering ceramic layer.

Patent Literature

Patent Literature 1: JP 2012-164784 A

BRIEF SUMMARY OF THE DISCLOSURE

The external terminal electrode of the multilayer ceramic electronic component disclosed in Patent Literature 1 has a corner. The corner has a shape that tends to cause stress concentration. When stress is concentrated at the corner, the electrode may be easily separated from the mounting substrate, or the electrode at the corner may be easily cracked.

Depending on the electrode arrangement, stress may be concentrated at a portion other than the corner. Also in such a case, the electrode may be easily separated from the mounting substrate or easily cracked.

In the multilayer ceramic electronic component disclosed in Patent Literature 1, the strength of the external terminal electrode is insufficient in terms of the above points.

The present disclosure was made to solve the above issues and aims to provide an electronic component in which separation of an electrode from a surface of an electronic component body and cracking of the electrode can be prevented even when stress is concentrated at the electrode.

An electronic component of the present disclosure includes: an electronic component body; an electrode on a surface of the electronic component body; and a cover layer having insulating properties on at least a portion of a perimeter of the electrode and extending across a boundary between the perimeter of the electrode and the surface of the electronic component body, wherein in a plan view of the electronic component body seen from a side where the electrode is disposed, the electrode includes corners each provided by two segments defining a portion of the perimeter of the electrode, and a thickness of at least a portion of the cover layer on at least one of the corners is greater than a thickness of the other portions of the cover layer on portions other than the corners.

An electronic component of the present disclosure includes: an electronic component body; an electrode on a surface of the electronic component body; and a cover layer having insulating properties on at least a portion of a perimeter of the electrode and extending across a boundary between the perimeter of the electrode and the surface of the electronic component body, wherein in a plan view of the electronic component body seen from a side where the electrode is disposed, the electrode includes corners each provided by two segments defining a portion of the perimeter of the electrode, and the cover layer on a portion other than the corners includes at least a portion whose thickness is greater than a thickness of the cover layer on another portion.

A method of producing an electronic component of the present disclosure includes: forming an electrode on a surface of an electronic component body; and forming a cover layer having insulating properties and extending across a boundary between a perimeter of the electrode and the surface of the electronic component body, wherein in the forming of the electrode, the electrode is formed such that a corner is formed by two segments on at least a portion of the perimeter of the electrode, and in the forming of the cover layer, portions of the cover layer are first formed along one of the two segments forming the corner, and the other portions of the cover layer are then formed along the other segment.

The electronic component of the present disclosure is an electronic component including an electrode in which separation of the electrode from a surface of an electronic component body and cracking of the electrode can be prevented even when stress is concentrated at the electrode.

The method of producing an electronic component of the present disclosure can produce an electronic component including an electrode in which separation of the electrode from a surface of an electronic component body and cracking of the electrode can be prevented even when stress is concentrated at the electrode.

BRIEF DESCRIPTION OF THE SEVERAL VIEWS OF THE DRAWINGS

FIG. 11B is a schematic plan view of another example of the electronic component according to the first embodiment of the present disclosure in which the electrode has rounded corners.

DETAILED DESCRIPTION OF THE DISCLOSURE

Hereinafter, the electronic component and the method of producing an electronic component of the present disclosure are described.

The present disclosure is not limited to the following preferred embodiments and may be suitably modified without departing from the gist of the present disclosure. Combinations of two or more preferred features described in the following preferred embodiments are also within the scope of the present disclosure.

The following preferred embodiments are examples, and features of different preferred embodiments can be partially exchanged or combined with each other. In the second preferred embodiment and subsequent preferred embodiments, a description of features common to the first preferred embodiment is omitted, and only different points are described. In particular, similar advantageous effects by similar features are not mentioned in each preferred embodiment.

In the description below, the electronic component of each embodiment is simply referred to as "the electronic component of the present disclosure" when no distinction is made among the embodiments.

First Embodiment

Figure 1A:
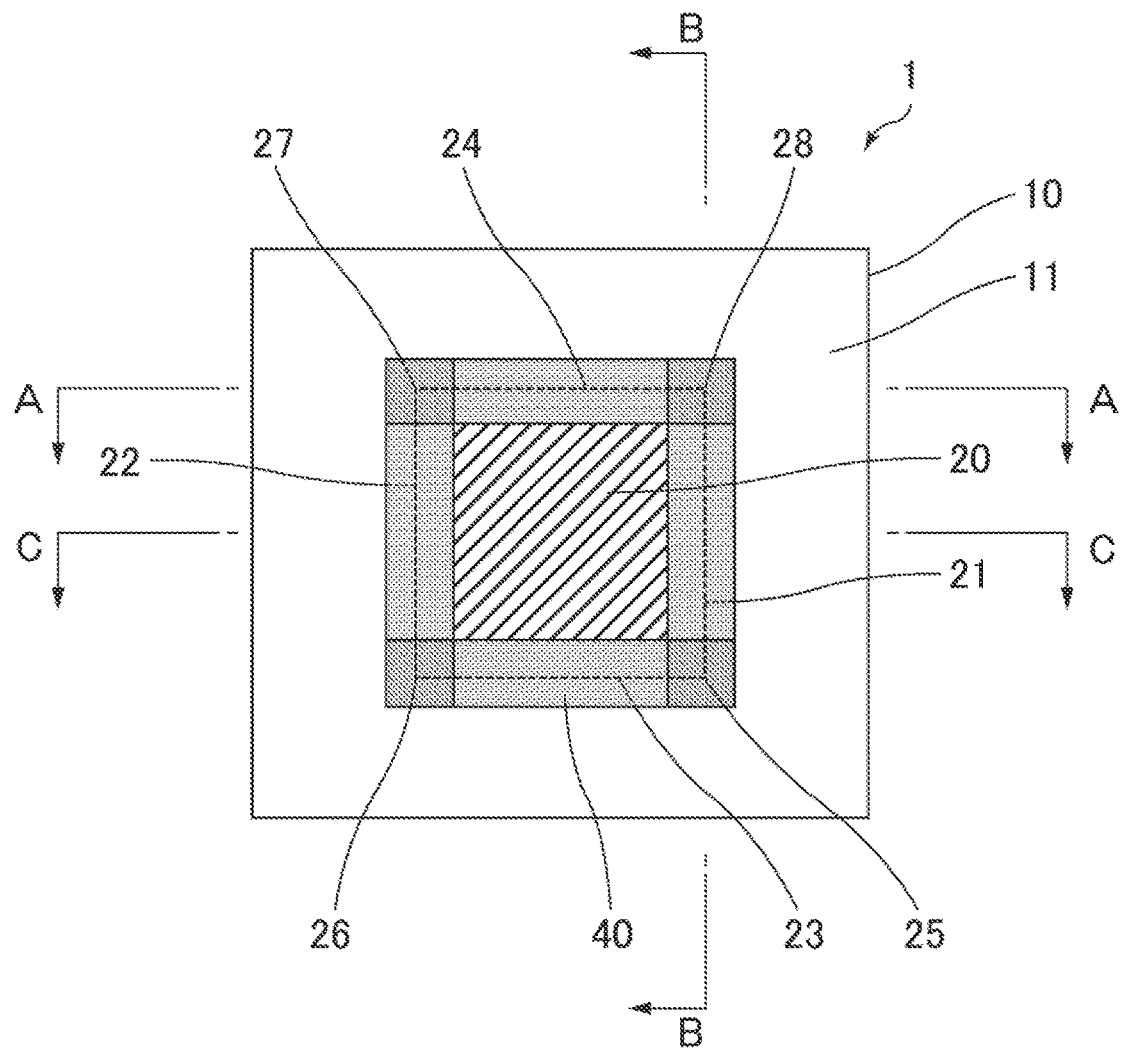
FIG. 1A is a schematic plan view of an example of an electronic component according to a first embodiment of the present disclosure.

FIG. 1A is a schematic plan view of an example of an electronic component according to a first embodiment of the present disclosure.

Figure 1B:
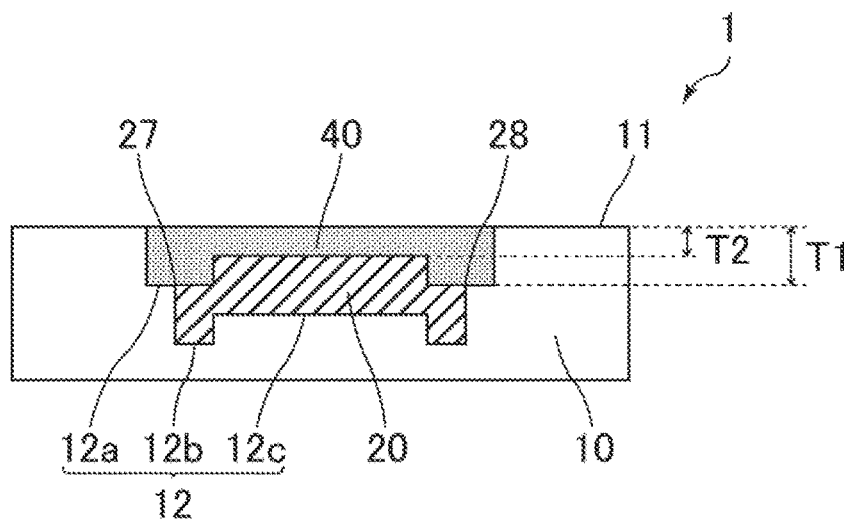
FIG. 1B is a cross-sectional view taken along line A-A in FIG. 1A.

FIG. 1B is a cross-sectional view taken along line A-A in FIG. 1A.

Figure 1C:
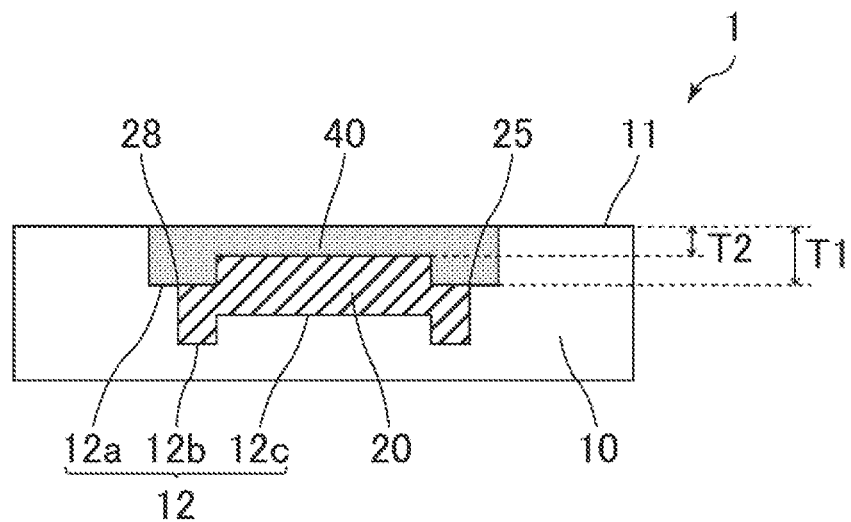
FIG. 1C is a cross-sectional view taken along line B-B in FIG. 1A.

FIG. 1C is a cross-sectional view taken along line B-B in FIG. 1A.

Figure 1D:
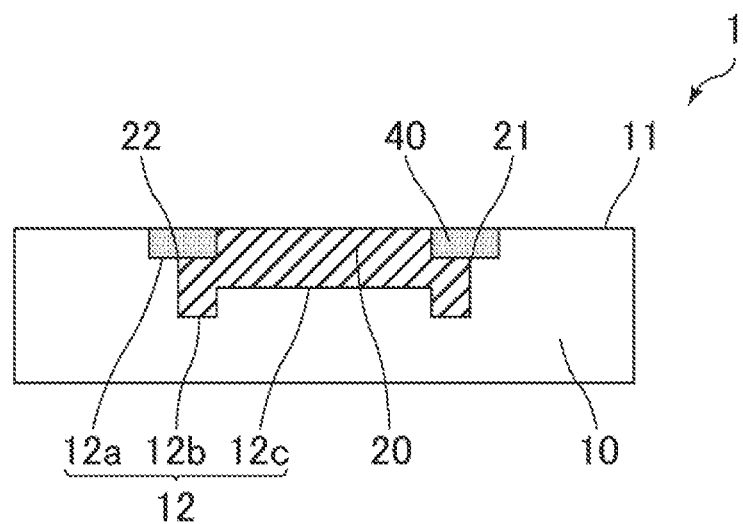
FIG. 1D is a cross-sectional view taken along line C-C in FIG. 1A.

FIG. 1D is a cross-sectional view taken along line C-C in FIG. 1A.

An electronic component 1 shown in FIG. 1A includes an electronic component body 10, an electrode 20 on a surface 11 of the electronic component body 10, and cover layers 40 having insulating properties and each extending across a boundary between the perimeter of the electrode 20 and the surface 11 of the electronic component body 10.

In a plan view of the electronic component body 10 seen from a side where the electrode 20 is disposed, the electrode 20 has a rectangular shape with a perimeter defined by a first segment 21, a second segment 22 parallel to the first segment 21, a third segment 23 perpendicular to the first segment 21, and a fourth segment 24 parallel to the third segment 23.

The electrode 20 includes a first corner 25 formed by the first segment 21 and the third segment 23, a second corner 26 formed by the second segment 22 and the third segment 23, a third corner 27 formed by the second segment 22 and the fourth segment 24, and a fourth corner 28 formed by the fourth segment 24 and the first segment 21.

Further, as shown in FIG. 1B and FIG. 1C, the electronic component body 10 includes a hole 12 in which the electrode 20 is disposed in the surface 11.

The hole 12 is defined by a first bottom 12a connected to the perimeter of the hole 12, a second bottom 12b connected to the first bottom 12a and inside the first bottom 12a, and a third bottom 12c connected to the second bottom 12b and inside the second bottom 12b.

The first bottom 12a is shallower than the second bottom 12b. The third bottom 12c is deeper than the first bottom 12a and shallower than the second bottom 12b.

In FIG. 1B and FIG. 1C, the first bottom 12a and the second bottom 12b form a step, and the second bottom 12b and the third bottom 12c form a step.

Specifically, the depth in the thickness direction of the hole 12 in which the electrode 20 is disposed is deeper at its perimeter than its central portion.

As shown in FIG. 1B and FIG. 1C, the electrode 20 covers the second bottom 12b and the third bottom 12c. The electrode 20 on the third bottom 12c protrudes upward.

As shown in FIG. 1B and FIG. 1C, the cover layer 40 covers the electrode 20 above the first bottom 12a and the second bottom 12b.

Further, a thickness T1 of the cover layer 40 on each corner is greater than a thickness T2 of the cover layer 40 on a portion other than the corners.

As shown in FIG. 1B and FIG. 1C, the cover layer 40 is embedded in the electronic component body 10, and its surface is at the same height as the surface 11 of the electronic component body 10.

Since the cover layer 40 is embedded in the electronic component body 10, the electrode 20 is embedded further down under the cover layer 40. With such a configuration, the electrode 20 is less likely to directly contact another object even when the electronic component body 10 is subjected to drop impact or handling impact in the production, so that separation of the electrode 20 from the surface 11 of the electronic component body 10 is more reliably prevented.

As shown in FIG. 1D, a surface of the electrode 20 not covered by the cover layers 40 is at the same height as the surface 11 of the electronic component body 10.

Also as shown in FIG. 1D, each cover layer 40 is embedded in the electronic component body 10, and its surface is at the same height as the surface 11 of the electronic component body 10.

In the electronic component 1 as described above, the thickness T1 of the cover layer 40 on each corner is greater than thickness T2 of the cover layer 40 on a portion other than the corners. Thus, the electrode 20 on each corner can be prevented from being cracked or separated from the surface 11 of the electronic component body 10, even when stress is generated at the corner. Such a configuration also improves the adhesion strength of the cover layers 40.

The electronic component 1 may include an internal electrode.

Next, a method of producing the electronic component according to the first embodiment of the present disclosure is described.

The method of producing the electronic component according to the first embodiment of the present disclosure includes (1) forming an electrode, (2) forming cover layers, (3) pressing, and (4) firing.

(1) Forming Electrode

Figure 2A:
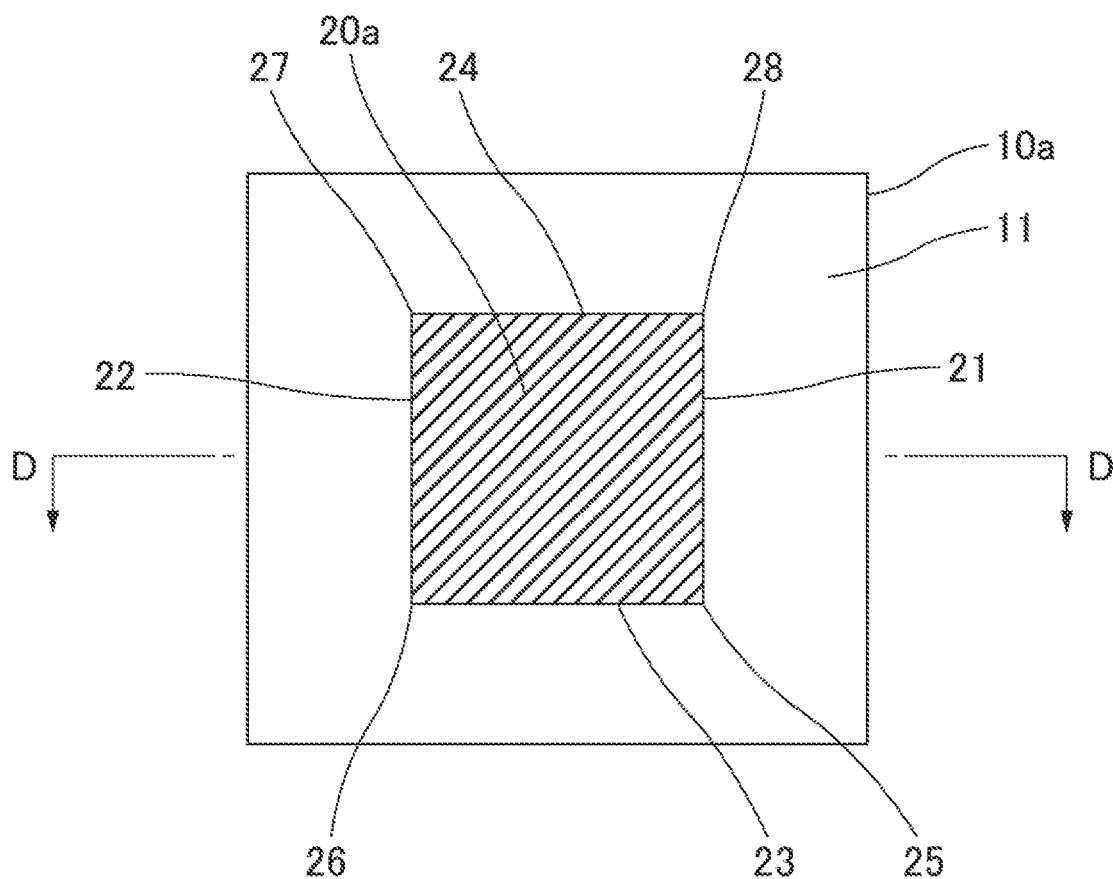
FIG. 2A is a schematic view of forming an electrode in a method of producing the electronic component according to the first embodiment of the present disclosure.

FIG. 2A is a schematic view of forming an electrode in a method of producing the electronic component according to the first embodiment of the present disclosure.

Figure 2B:
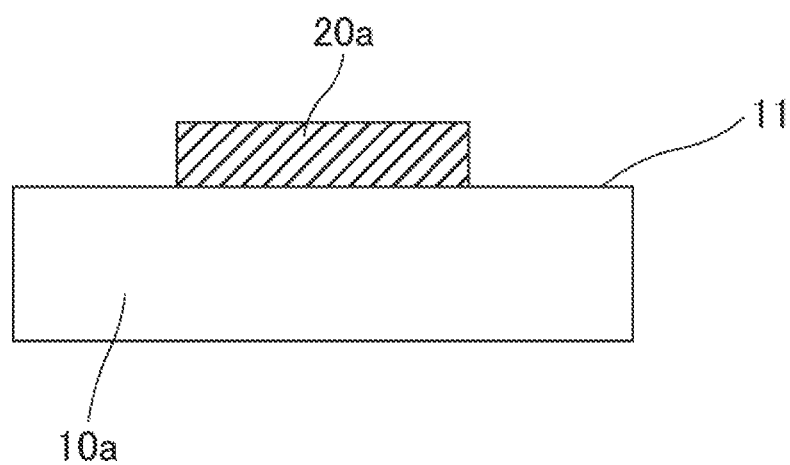
FIG. 2B is a cross-sectional view taken along line D-D in FIG. 2A.

FIG. 2B is a cross-sectional view taken along line D-D in FIG. 2A.

As shown in FIG. 2A and FIG. 2B, in the forming of the electrode, a conductive paste is applied to the surface 11 of a ceramic layer 10a and dried, whereby a green electrode 20a is formed on the surface of the ceramic layer 10a.

In the forming of the electrode, before forming the green electrode 20a, a hole may be made in the ceramic layer 10a and filled with a conductive paste to form a via or the like connected to the green electrode 20a.

As shown in FIG. 2A, the green electrode 20a formed has a rectangular shape in a plan view with a perimeter defined by the first segment 21, the second segment 22 parallel to the first segment 21, the third segment 23 perpendicular to the first segment 21, and the fourth segment 24 parallel to the third segment 23.

The corner formed by the first segment 21 and the third segment 23 is the first corner 25. The corner formed by the second segment 22 and the third segment 23 is the second corner 26. The corner formed by the second segment 22 and the fourth segment 24 is the third corner 27. The corner formed by the fourth segment 24 and the first segment 21 is the fourth corner 28.

The first corner 25, the second corner 26, the third corner 27, and the fourth corner 28 are the four corners of the rectangular shape.

The ceramic layer 10a may be a ceramic green sheet. The ceramic green sheet can be formed, for example, by doctor blading a ceramic slurry on a carrier film.

The ceramic slurry may contain, for example, a ceramic powder, a binder, and a plasticizer. The ceramic material may be, for example, a low temperature co-fired ceramic (LTCC) material. The low temperature sintered ceramic material is a ceramic material that can be sintered at a temperature of 1000° C. or lower and that can be co-fired with low resistive Au, Ag, Cu, or the like. Specific examples of the low temperature co-fired ceramic material include glass composite-based low-temperature sintering ceramic materials in which a ceramic material such as alumina, zirconia, magnesia, or forsterite is mixed with borosilicate glass; crystallized glass-based low-temperature co-fired ceramic materials containing $ZnO$—$MgO$—$Al_2O_3$—$SiO_2$- based crystallized glass; and non-glass low-temperature co-fired ceramic material containing a BaO—$Al_2O_3$—$SiO_2$-based ceramic material or a $Al_2O_3$—CaO—$SiO_2$—MgO—$B_2O_3$-based ceramic material.

Preferably, the thickness of the ceramic green sheet is 5 µm or more and 100 µm or less, for example.

The conductive paste is not limited and may contain, for example, a conductive metal powder, a binder, and a plasticizer. A co-base material (ceramic powder) for adjusting shrinkage may be added to the conductive paste. Examples of conductive metal materials contained in the conductive paste include metals containing at least one of Ag, a Ag—Pt alloy, a Ag—Pd alloy, Cu, Ni, Pt, Pd, W, Mo, and Au as a main component. Of these conductive metal materials, Ag, a Ag—Pt alloy, a Ag—Pd alloy, and Cu are more preferably used particularly for conductive patterns for high frequency applications because these materials have low resistivity.

The conductive paste may or may not contain a glass component.

The conductive paste containing a glass component can improve the sinterability between the electrode and the electronic component body, which are formed through the subsequent steps.

The conductive paste free of a glass component has a higher metal purity, and the resulting electrode also has a higher metal purity. Thus, the resistance of the electrode can be reduced.

An electrode having desired electrical characteristics and structure can be obtained by adjusting the proportion of the glass component in the conductive paste.

(2) Forming Cover Layers

In the forming of the cover layers, the cover layers 40 having insulating properties and each extending across a boundary between the perimeter of the green electrode 20a and the surface 11 of the ceramic layer 10a are formed in two separate times.

The cover layers 40 can be formed by screen printing.

When forming the cover layers 40 by screen printing, the cover layers 40 are formed by moving a printing squeegee.

First-time cover layer formation is first described with reference to the drawings.

Figure 3A:
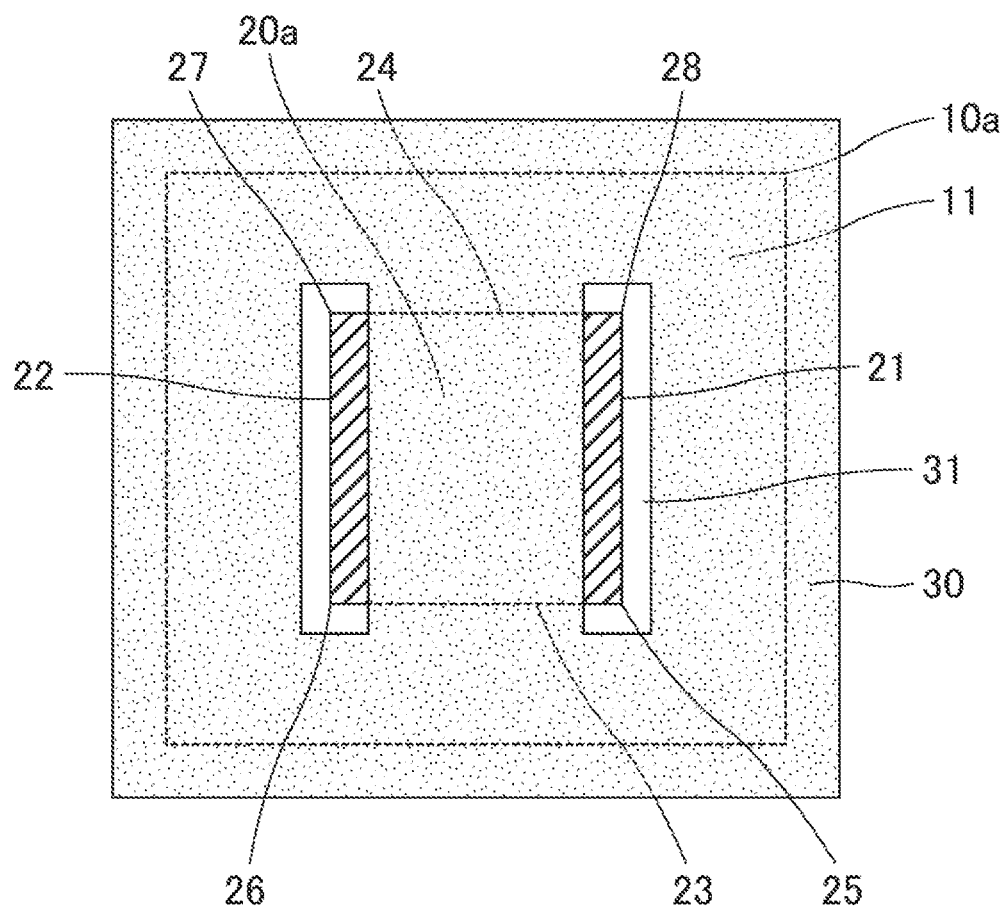
FIG. 3A is a schematic view of an example of first-time metal mask arrangement in the forming of the cover layers in the method of producing the electronic component according to the first embodiment of the present disclosure.

FIG. 3A is a schematic view of an example of first-time metal mask arrangement in the forming of the cover layers in the method of producing the electronic component according to the first embodiment of the present disclosure.

Figure 3B:
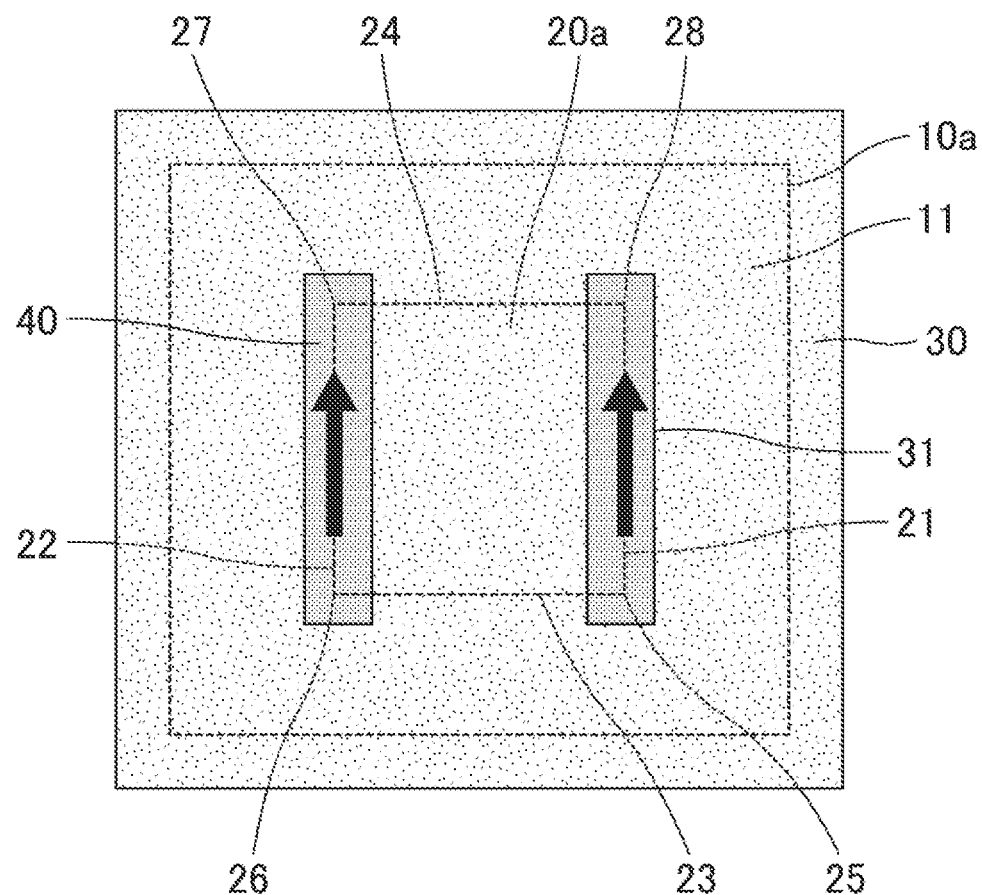
FIG. 3B is a schematic view of an example of first-time cover layer formation in the forming of the cover layers in the method of producing the electronic component according to the first embodiment of the present disclosure.

FIG. 3B is a schematic view of an example of the first-time cover layer formation in the forming of the cover layers in the method of producing the electronic component according to the first embodiment of the present disclosure.

Figure 3C:
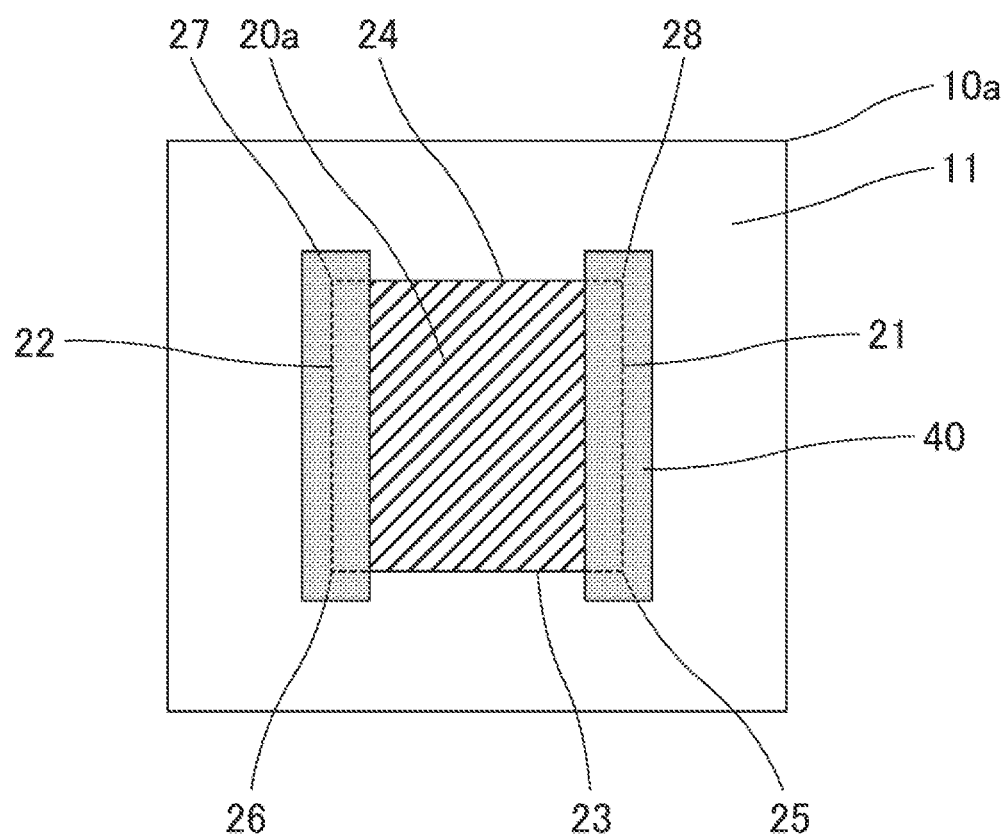
FIG. 3C is a schematic view of an example of a state after the first-time cover layer formation in the forming of the cover layers in the method of producing the electronic component according to the first embodiment of the present disclosure.

FIG. 3C is a schematic view of an example of a state after the first-time cover layer formation in the forming of the cover layers in the method of producing the electronic component according to the first embodiment of the present disclosure.

As shown in FIG. 3A, the green electrode 20a and the ceramic layer 10a are covered by a metal mask 30 including openings 31 along the first segment 21 and the second segment 22 for exposing boundaries between the green electrode 20a and the ceramic layer 10a.

Next, as shown in FIG. 3B, a printing squeegee is moved in the direction indicated by arrows along the first segment 21 and the second segment 22 to form the cover layers 40. Thus, as shown in FIG. 3C, the cover layers 40 are formed on the first segment 21 and the second segment 22.

Next, second-time cover layer formation is described with reference to the drawings.

Figure 4A:
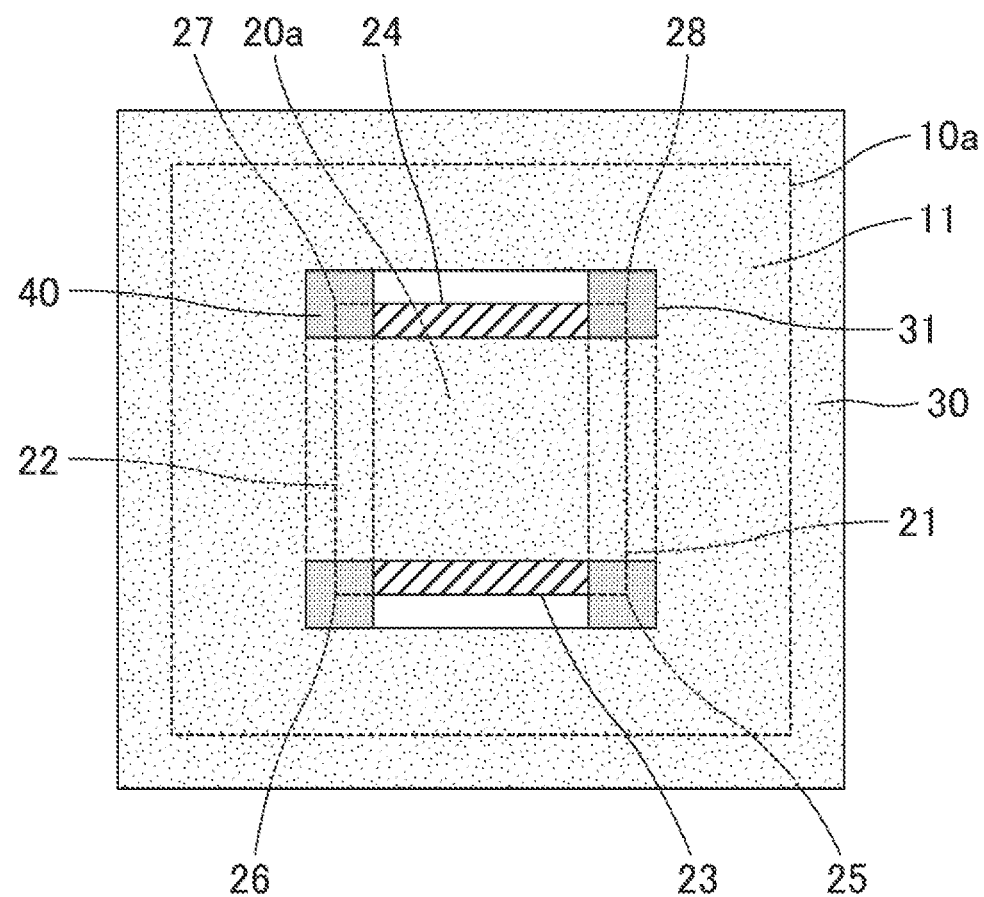
FIG. 4A is a schematic view of an example of a second-time metal mask arrangement in the forming of the cover layers in the method of producing the electronic component according to the first embodiment of the present disclosure.

FIG. 4A is a schematic view of an example of second-time metal mask arrangement in the forming of the cover layers in the method of producing the electronic component according to the first embodiment of the present disclosure.

Figure 4B:
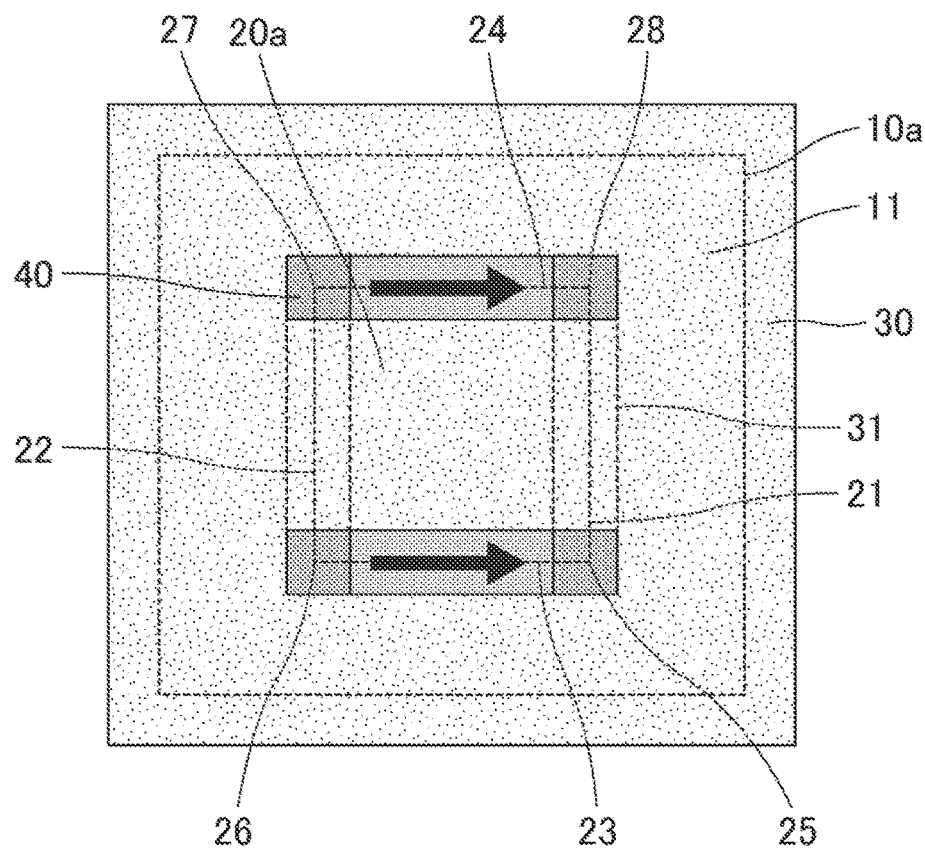
FIG. 4B is a schematic view of an example of the second-time cover layer formation in the forming of the cover layers in the method of producing the electronic component according to the first embodiment of the present disclosure.

FIG. 4B is a schematic view of an example of the second-time cover layer formation in the forming of the cover layers in the method of producing the electronic component according to the first embodiment of the present disclosure.

Figure 4C:
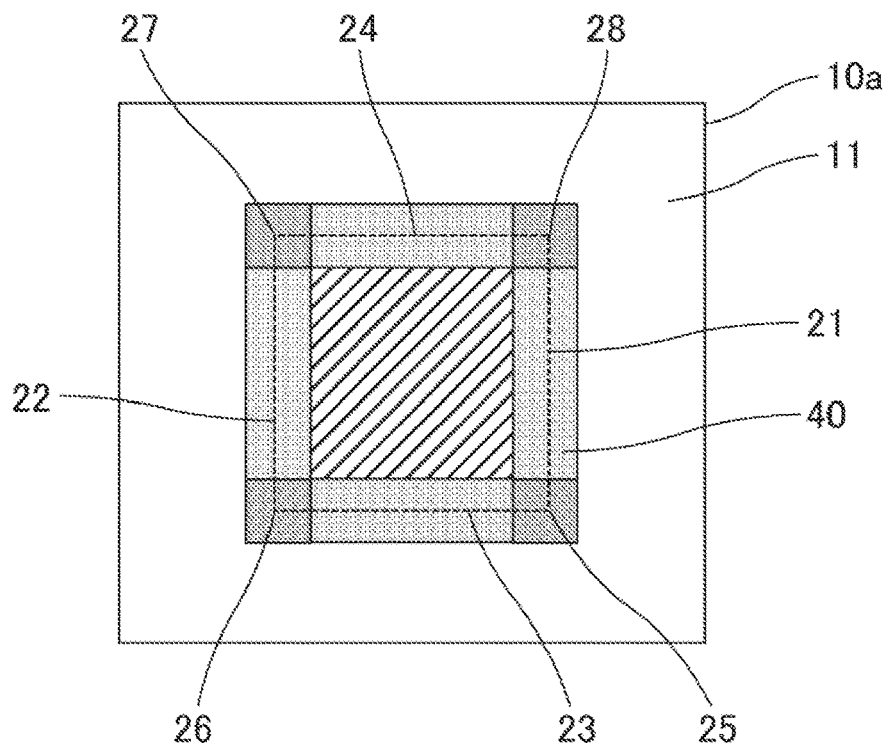
FIG. 4C is a schematic view of an example of a state after the second-time cover layer formation in the forming of the cover layers in the method of producing the electronic component according to the first embodiment of the present disclosure.

FIG. 4C is a schematic view of an example of a state after the second-time cover layer formation in the forming of the cover layers in the method of producing the electronic component according to the first embodiment of the present disclosure.

As shown in FIG. 4A, the green electrode 20a and the ceramic layer 10a are covered by the metal mask 30 including the openings 31 along the third segment 23 and the fourth segment 24 for exposing boundaries between the green electrode 20a and the ceramic layer 10a. Specifically, the metal mask 30 is rotated by 90° to cover the green electrode 20a and the ceramic layer 10a.

Next, as shown in FIG. 4B, the printing squeegee is moved in the direction indicated by arrows along the third segment 23 and the fourth segment 24 to form the cover layers 40. Thus, as shown in FIG. 4C, the cover layers 40 are formed on the third segment 23 and the fourth segment 24.

In the description of the forming of the cover layers, the metal mask is rotated for the second-time cover layer formation. However, in the method of producing the electronic component according to the first embodiment of the present disclosure, the green electrode and the ceramic layer may be rotated instead of the metal mask.

In the method of producing the electronic component according to the first embodiment of the present disclosure, the cover layers may be formed using two separate metal masks, one for the first-time cover layer formation and one for the second-time cover layer formation. Here, metal masks having different opening shapes may be used.

In the case of forming the cover layers by screen printing, when the printing squeegee passes substantially orthogonally to an edge of the opening 31 of the metal mask 30, printing smudge occurs at the edge, making it difficult to obtain an electrode with sufficient dimensional accuracy. However, in the method of producing the electronic component according to the first embodiment of the present disclosure, the printing squeegee passes along the edge of the opening 31 of the metal mask instead of passing substantially orthogonally to the edge of the opening 31 of the metal mask, so that printing smudge is less likely to occur. Thus, the electrode 20 with sufficient dimensional accuracy can be produced.

Further, in the method of producing the electronic component according to the first embodiment of the present disclosure, the cover layers 40 are first formed along the first segment 21 and the second segment 22 at the same time, and the cover layers 40 are then formed along the third segment 23 and the fourth segment 24 at the same time. Thus, the cover layers 40 can be formed around the green electrode 20a simply by performing the cover layer formation twice.

When the cover layers 40 are formed as described above, the cover layers 40 on the first corner 25, the second corner 26, the third corner 27, and the fourth corner 28 are thicker than the cover layers 40 on portions other than the corners.

Thus, in the electronic component obtained through firing (described later), the electrode 20 on each corner can be prevented from being cracked or separated from the surface 11 of the electronic component body 10, even when stress is generated at the corner. Such a configuration also improves the adhesion strength of the cover layers 40.

The material of the cover layer 40 is not limited. For example, a raw material powder mixture obtained by adding an appropriate amount of alumina ($Al_2O_3$) powder to a ceramic powder for the ceramic slurry and mixing these components can be dispersed in an organic vehicle and kneaded therein to produce a ceramic paste for cover layers.

The organic vehicle is a mixture of a binder and a solvent. The types of the binder and the solvent and proportions thereof in the mixture are not limited. Examples of the organic vehicle that can be used include one obtained by dissolving an acrylic resin, alkyd resin, butyral resin, ethyl cellulose, or the like in an alcohol such as terpineol, isopropylene alcohol, butyl carbitol, butyl carbitol acetate, or the like. Various types of dispersants, plasticizers, and activators may be added to the organic vehicle, if necessary.

(3) Pressing

Figure 5A:
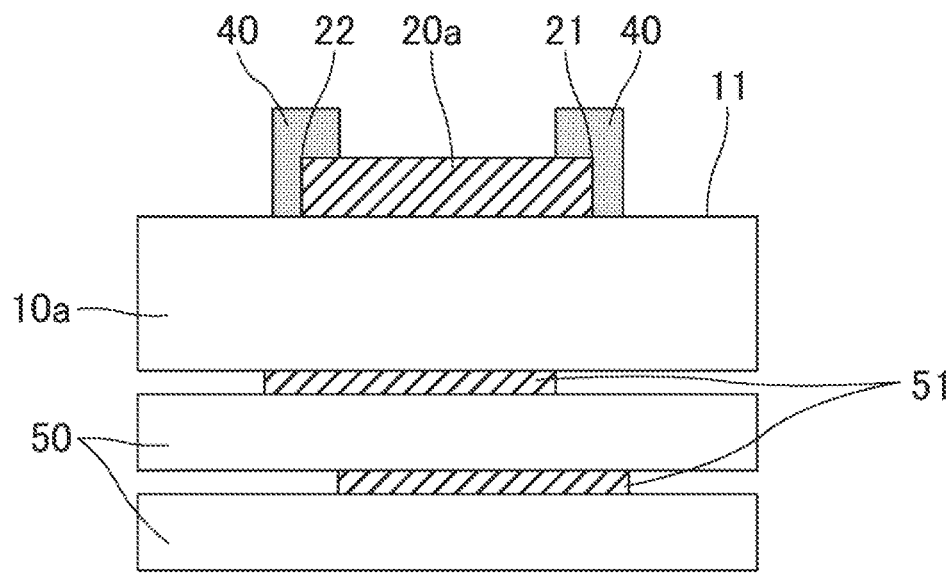
FIG. 5A is a schematic cross-sectional view of a state before pressing in the method of producing the electronic component according to the first embodiment of the present disclosure.

FIG. 5A is a schematic cross-sectional view of a state before pressing in the method of producing the electronic component according to the first embodiment of the present disclosure.

Figure 5B:
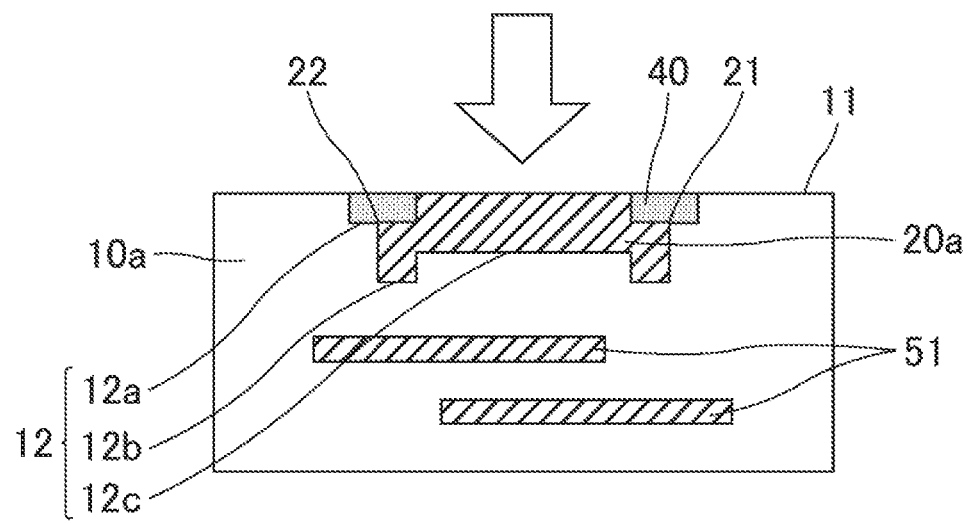
FIG. 5B is a schematic cross-sectional view of a state after pressing in the method of producing the electronic component according to the first embodiment of the present disclosure.

FIG. 5B is a schematic cross-sectional view of a state after pressing in the method of producing the electronic component according to the first embodiment of the present disclosure.

Next, as shown in FIG. 5A, the ceramic layer 10a with the green electrode 20a printed thereon is stacked on a lower ceramic layer 50 with an internal electrode 51 printed thereon. Subsequently, pressing is performed as shown in FIG. 5B. This causes the green electrode 20a and the cover layers 40 to collapse and sink into the ceramic layer 10a.

As the green electrode 20a sinks into the ceramic layer 10a, the hole 12 defined by the first bottom 12a, the second bottom 12b, and the third bottom 12c is formed.

Subsequently, the stack may be cut into predetermined shapes to obtain chips. Here, the chips may be chamfered by barreling.

(4) Firing

Subsequently, the stack is fired under predetermined conditions to convert the ceramic layer 10a into the electronic component body 10 and convert the green electrode 20a into the electrode 20, whereby the electronic component 1 according to the first embodiment of the present disclosure can be produced.

The cover layer 40 formed on each of the first corner 25, the second corner 26, the third corner 27, and the fourth corner 28 is made of two layers, but these layers of the cover layer 40 are integrated by firing, and the boundary between the layers disappears.

Subsequently, the electrode formed on the electronic component may be plated. Plating the electrode can facilitate the contact between the electrode and components to be mounted.

Next, another embodiment of the electronic component according to the first embodiment of the present disclosure is described.

Figure 6A:
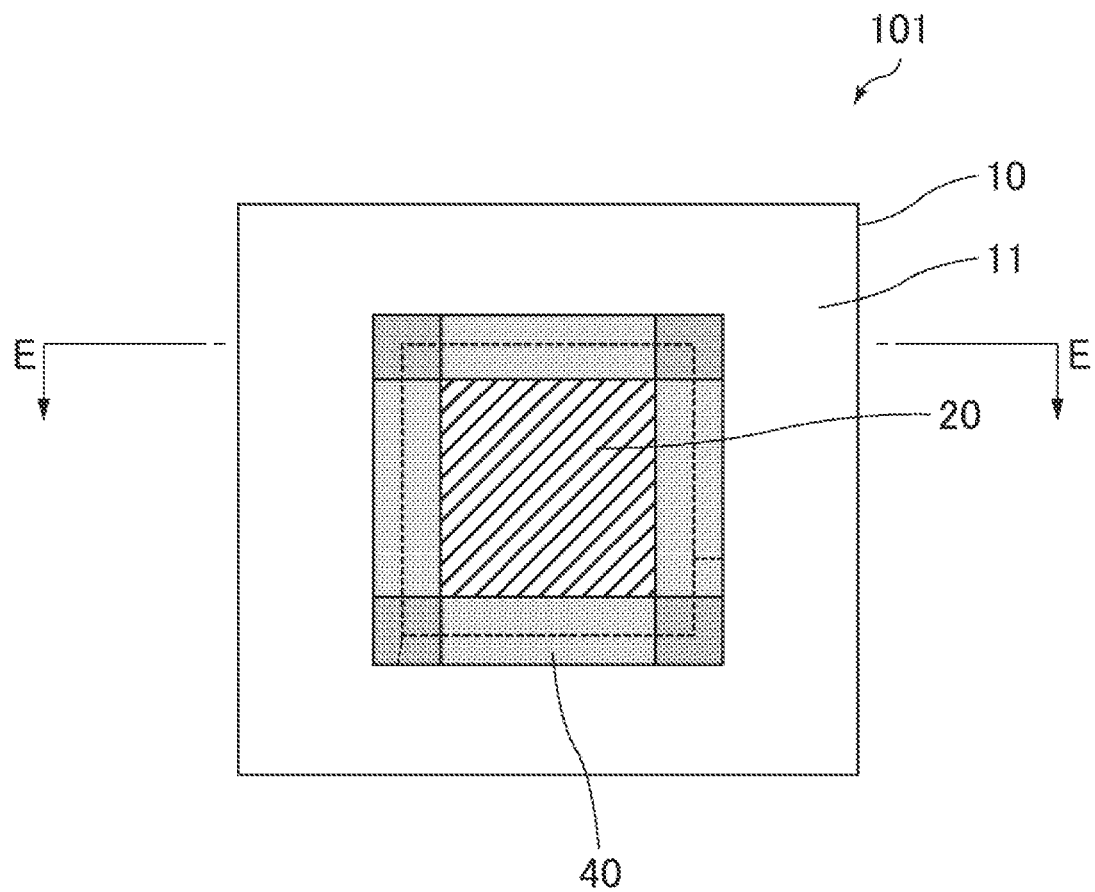
FIG. 6A is a schematic plan view of another example of the electronic component according to the first embodiment of the present disclosure.

FIG. 6A is a schematic plan view of another example of the electronic component according to the first embodiment of the present disclosure.

Figure 6B:
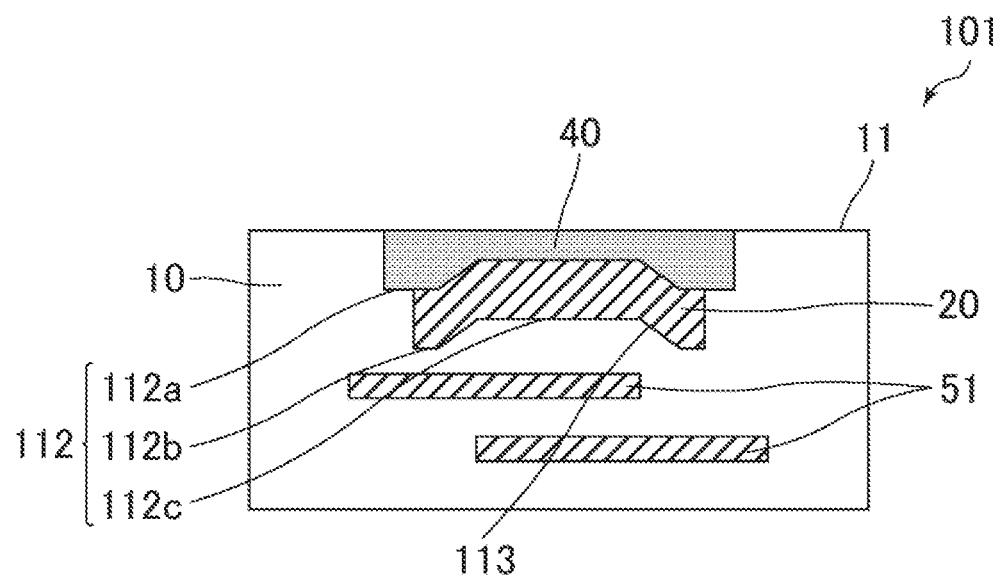
FIG. 6B is a cross-sectional view taken along line E-E in FIG. 6A.

FIG. 6B is a cross-sectional view taken along line E-E in FIG. 6A.

An electronic component 101 according to the first embodiment of the present disclosure shown in FIG. 6A and FIG. 6B has the same configuration as the electronic component 1 according to the first embodiment of the present disclosure, except that the shape of a hole 112 is different as described below and that the internal electrode is directly below the electrode.

As shown in FIG. 6B, the electronic component body 10 includes the hole 112 in the surface 11.

The hole 112 is defined by a first bottom 112a connected to the perimeter of the hole 112, a second bottom 112b connected to the first bottom 112a and inside the first bottom 112a, and a third bottom 112c connected to the second bottom 112b and inside the second bottom 112b.

The first bottom 112a is shallower than the second bottom 112b. The third bottom 112c is deeper than the first bottom 112a and shallower than the second bottom 112b.

In FIG. 6B, the first bottom 112a and the second bottom 112b form a step, and the second bottom 112b and the third bottom 112c are connected to each other by a slope 113.

In the electronic component 101, the internal electrode 51 is directly below the electrode 20.

Since the internal electrode is directly below the electrode 20, the press pressure is concentrated at where the internal electrode is embedded below the electrode 20 during pressing in the production of the electronic component 101. As a result, the slope 113 is easily formed. The slope 113 is also easily formed as a result of flowing of the glass component in the ceramic layer during firing.

The glass component is a component preferably contained in the ceramic layers and the cover layers for use in the production of the electronic component of the present disclosure.

Next, another electronic component according to the first embodiment of the present disclosure is described.

Figure 7A:
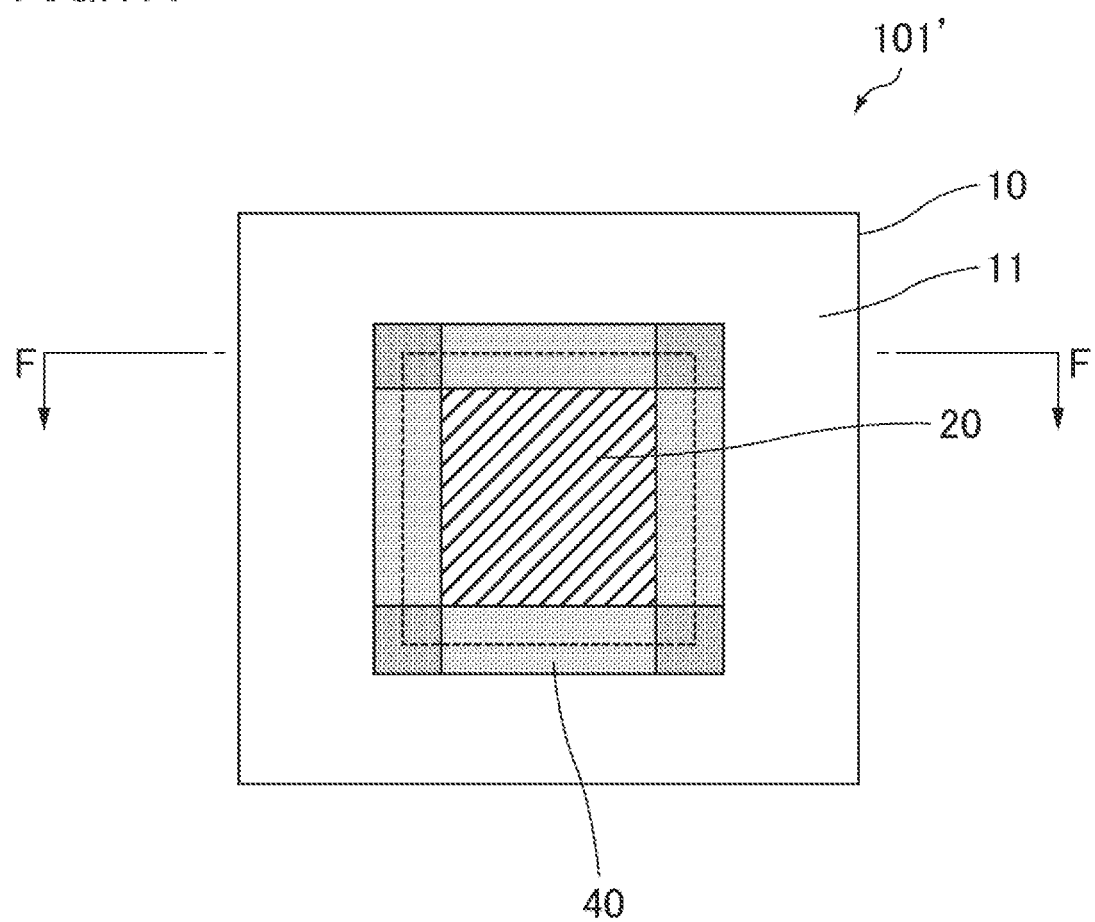
FIG. 7A is a schematic plan view of another example of the electronic component according to the first embodiment of the present disclosure.

FIG. 7A is a schematic plan view of another example of the electronic component according to the first embodiment of the present disclosure.

Figure 7B:
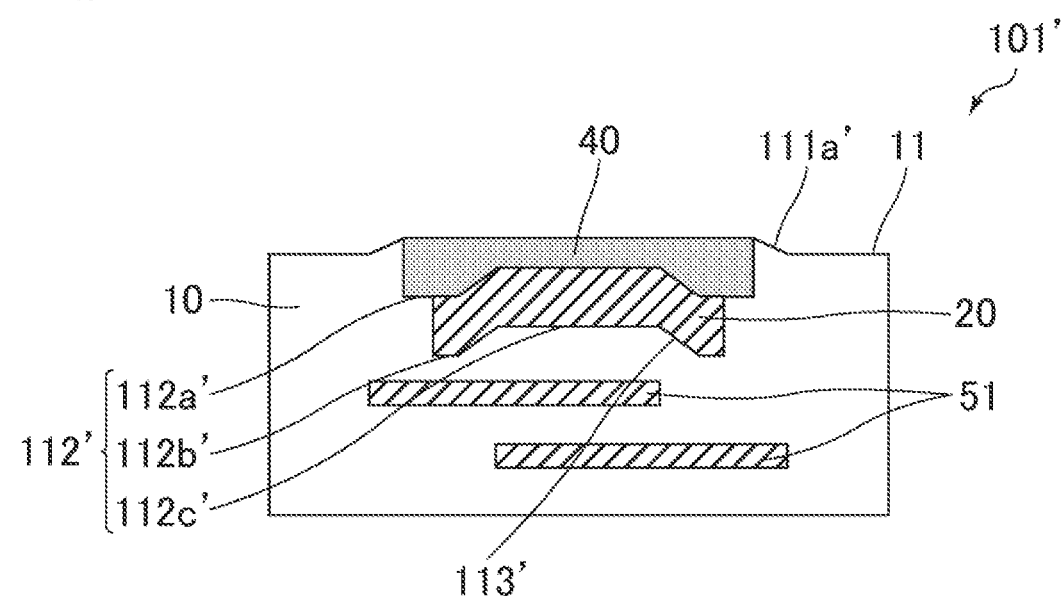
FIG. 7B is a cross-sectional view taken along line F-F in FIG. 7A.

FIG. 7B is a cross-sectional view taken along line F-F in FIG. 7A.

An electronic component 101' according to the first embodiment of the present disclosure shown in FIG. 7A and FIG. 7B has the same configuration as the electronic component 101 according to the first embodiment of the present disclosure, except that the shapes of the surface 11 and a hole 112' of the electronic component body 10 are different as described below and that the internal electrode is directly below the electrode.

As shown in FIG. 7B, the electronic component body 10 includes the hole 112' in the surface 11. A raised portion 111a' where the surface 11 of the electronic component body 10 is raised is made around the hole 112'.

The hole 112' is defined by a first bottom 112a' connected to the perimeter of the hole 112', a second bottom 112b' connected to the first bottom 112a' and inside the first bottom 112a', and a third bottom 112c' connected to the second bottom 112b' and inside the second bottom 112b'.

The first bottom 112a' is shallower than the second bottom 112b'. The third bottom 112c' is deeper than the first bottom 112a' and shallower than the second bottom 112b'.

In FIG. 7B, the first bottom 112a' and the second bottom 112b' form a step, and the second bottom 112b' and the third bottom 112c' are connected to each other by a slope 113'.

In the electronic component 101', the internal electrode 51 is directly below the electrode 20.

As shown in FIG. 7B, the height of the surface of the cover layer 40 coincides with an apex of the raised portion 111a'. Specifically, the cover layer 40 protrudes from the surface 11 of the electronic component body 10.

The raised portion 111a' is formed by reducing the press pressure during pressing in the production of the electronic component 101'.

Next, still another electronic component according to the first embodiment of the present disclosure is described.

Figure 8A:
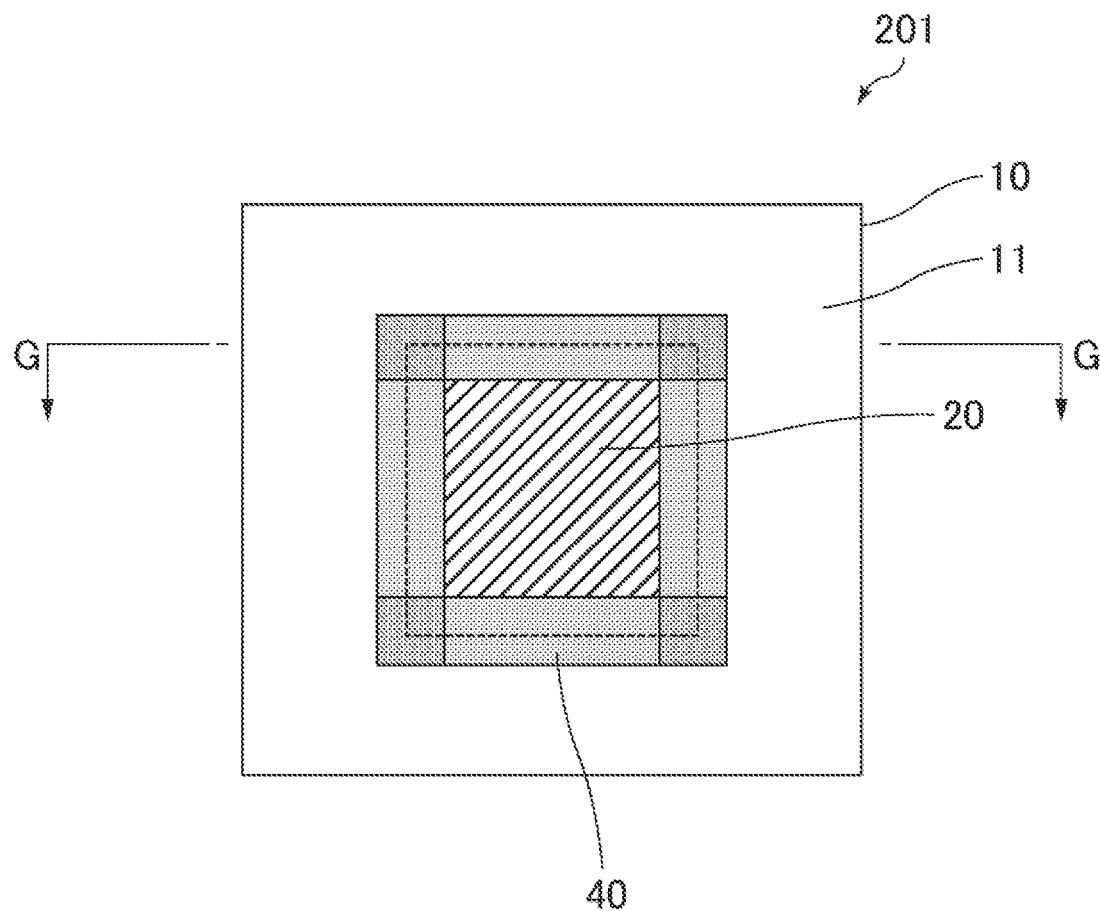
FIG. 8A is a schematic plan view of another example of the electronic component according to the first embodiment of the present disclosure.

FIG. 8A is a schematic plan view of another example of the electronic component according to the first embodiment of the present disclosure.

Figure 8B:
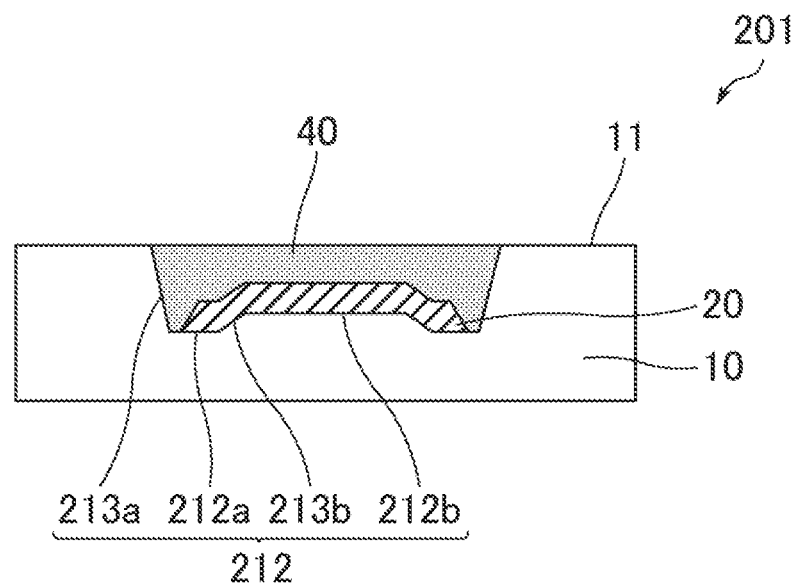
FIG. 8B is a cross-sectional view taken along line G-G in FIG. 8A.

FIG. 8B is a cross-sectional view taken along line G-G in FIG. 8A.

An electronic component 201 according to the first embodiment of the present disclosure according to FIG. 8A and FIG. 8B has the same configuration as the electronic component 1 according to the first embodiment of the present disclosure, except that the shape of a hole 212 is different as described below.

As shown in FIG. 8B, the electronic component body 10 includes the hole 212 in the surface 11.

The hole 212 includes a first slope 213a connected to the perimeter of the hole 212, a first bottom 212a connected to the inside of the first slope 213a, a second slope 213b connected to the inside of the first bottom 212a, and a second bottom 212b connected to the inside of the second slope 213b.

The first bottom 212a is deeper than the second bottom 212b.

The cover layer 40 is in contact with a surface of the first slope 213a.

The cover layer 40 is in contact with an outer surface of the first bottom 212a, and the electrode 20 is in contact with an inner surface of the first bottom 212a.

The electrode 20 is in contact with a surface of the second slope 213b and a surface of the second bottom 212b.

The electrode 20 has a periphery that gradually becomes thinner.

The electronic component 201 as described above can be produced by forming the green electrode and the cover layers as described below in the forming of the electrode and the forming of the cover layers.

Figure 9:
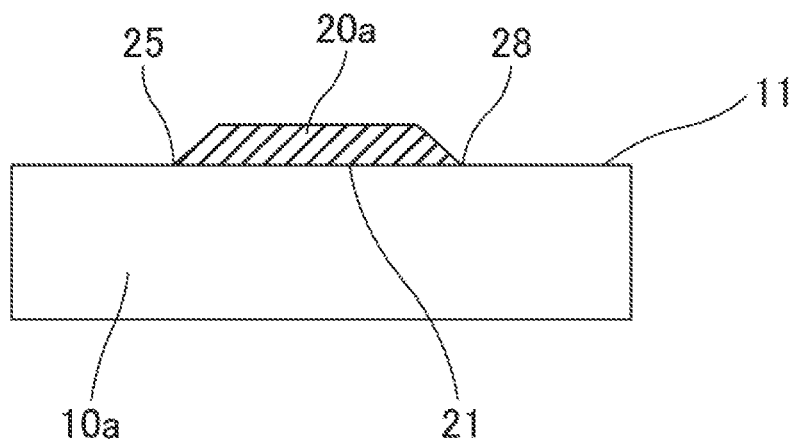
FIG. 9 is a schematic view of forming an electrode in the production of the electronic component according to FIG. 8A and FIG. 8B.

FIG. 9 is a schematic view of forming the electrode in the production of the electronic component according to FIG. 8A and FIG. 8B.

When producing the electronic component 201, as shown in FIG. 9, in the forming of the electrode, a conductive paste is applied to the surface 11 of the ceramic layer 10a and dried, whereby the green electrode 20a is formed on the surface of the ceramic layer 10a. Here, the composition of the conductive paste is controlled to adjust the viscosity and the like, whereby the green electrode 20a can have a periphery that gradually becomes thinner.

Next, the cover layers 40 having insulating properties and each extending across a boundary between the perimeter of the green electrode 20a and the surface 11 of the ceramic layer 10a are formed in two separate times as described below.

Figure 10A:
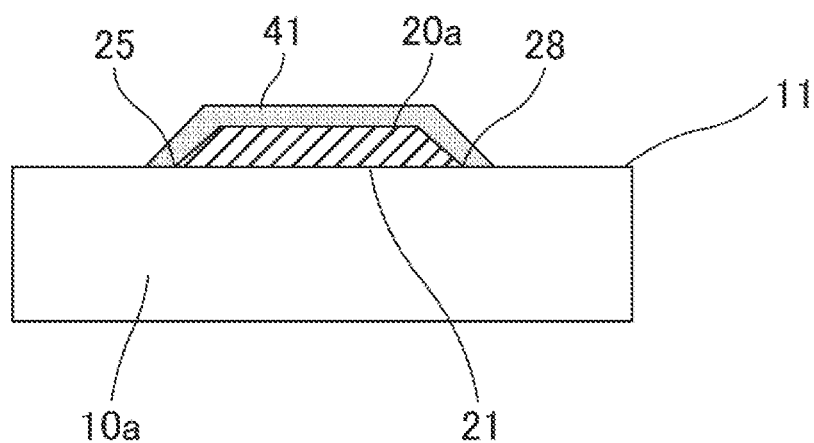
FIG. 10A is a schematic view of first-time cover layer formation in the forming of the cover layers in the production of the electronic component according to FIG. 8A and FIG. 8B.

FIG. 10A is a schematic view of first-time cover layer formation in the forming of the cover layers in the production of the electronic component according to FIG. 8A and FIG. 8B.

Figure 10B:
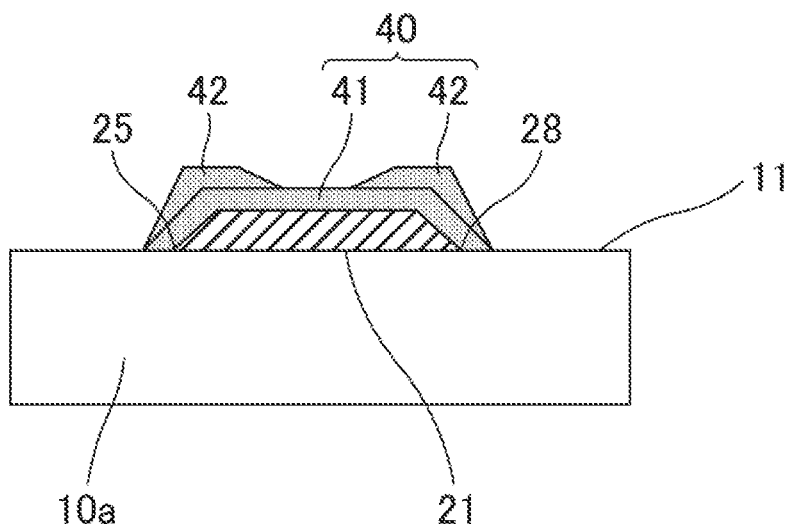
FIG. 10B is a schematic view of the second-time cover layer formation in the forming of the cover layers in the production of the electronic component according to FIG. 8A and FIG. 8B.

FIG. 10B is a schematic view of second-time cover layer formation in the forming of the cover layers in the production of the electronic component according to FIG. 8A and FIG. 8B.

The first-time cover layer formation is first described with reference to the drawings.

As shown in FIG. 10A, in the first-time cover layer formation, a first cover layer 41 is formed along the first segment 21 from the first corner 25 to the fourth corner 28. Here, the composition of the first cover layer 41 is adjusted to adjust the viscosity and the like, whereby the first cover layer 41 can have a periphery that gradually becomes thinner.

At the same time, the first cover layer 41 is also similarly formed from the second corner (not shown) to the third corner (not shown).

Next, the second-time cover layer formation is described with reference to the drawings.

As shown in FIG. 10B, in the second-time cover layer formation, second cover layers 42 are formed from the second corner (not shown) to the first corner 25 and also from the third corner (not shown) to the fourth corner 28. Here, the composition of the second cover layers 42 is adjusted to adjust the viscosity and the like, whereby the second cover layers 42 each can have a periphery that gradually becomes thinner.

Pressing is performed after the green electrode 20a and the cover layer 40 are formed as described above, whereby the green electrode 20a and the cover layers 40 sink into the ceramic layer 10a to a degree corresponding to the thickness of the green electrode 20a and the cover layer 40.

Subsequently, firing is performed, whereby the electronic component 201 shown in FIG. 8A and FIG. 8B can be formed.

Other Embodiments

In the electronic component 1, the electrode 20 has a rectangular shape, but in the electronic component of the present disclosure, the electrode may have any shape as long as it has corners each formed by two segments defining a portion of the perimeter of the electrode.

Preferably, each corner has an angle of more than 0 degrees and not more than 90 degrees.

In the electronic component of the present disclosure, the corners of the electrode may be rounded. Such an embodiment is described with reference to the drawings.

Figure 11A:
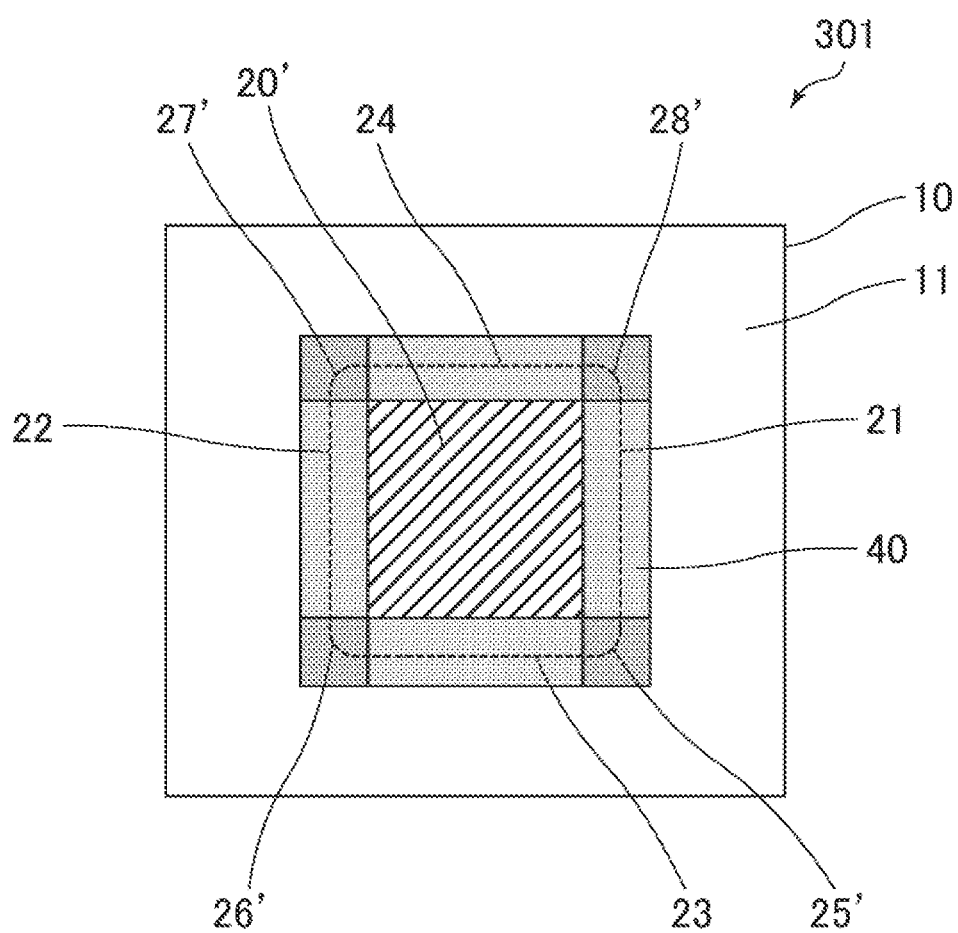
FIG. 11A is a schematic plan view of an example of the electronic component according to the first embodiment of the present disclosure in which the electrode has rounded corners.

FIG. 11A is a schematic plan view of an example of the electronic component according to the first embodiment of the present disclosure in which the electrode has rounded corners.

FIG. 11B is a schematic plan view of another example of the electronic component according to the first embodiment of the present disclosure in which the electrode has rounded corners.

An electronic component 301 shown in FIG. 11A has the same configuration as the electronic component 1 shown in FIG. 1A, except that a first corner 25', a second corner 26', a third corner 27', and a fourth corner 28' of an electrode 20' are rounded.

When the corners are rounded, stress concentration at the corners can be prevented, so that cracking of the corners can be prevented.

An electronic component 302 shown in FIG. 11B has the same configuration as the electronic component 1, except that the first corner 25', the second corner 26', the third corner 27', and the fourth corner 28' of the electrode 20' are rounded and that cover layers 40' extend along the rounded corners.

When the corners are rounded as described above, stress concentration at the corners can be prevented, so that cracking of the corners can be prevented. The cover layer 40' along each of the rounded corners can further prevent stress concentration.

The cover layer 40' can be formed by any method. For example, the cover layer 40' can be formed by controlling the shape of a metal mask.

The electronic component 1 shown in FIG. 1A includes the cover layers 40 along the four sides of the electrode 20, but in the electronic component of the present disclosure, it suffices as long as the cover layers are formed along at least two sides forming one corner of the electrode.

Further, the electronic component according to the first embodiment of the present disclosure may include multiple electrodes. Such an embodiment is described with reference to the drawings.

Figure 12:
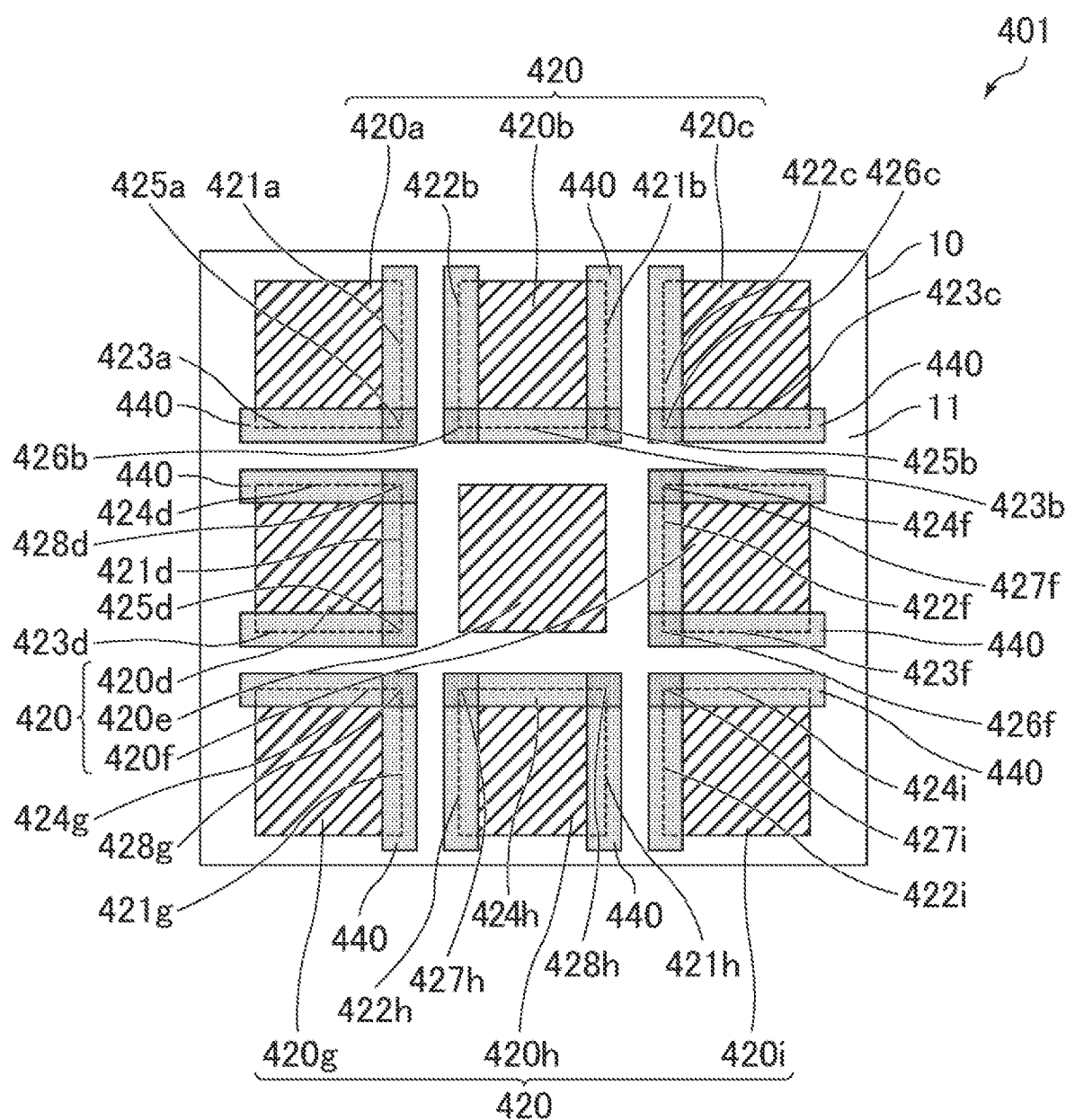
FIG. 12 is a schematic plan view of an example of the electronic component according to the first embodiment of the present disclosure including multiple electrodes.

FIG. 12 is a schematic plan view of an example of the electronic component according to the first embodiment of the present disclosure including multiple electrodes.

An electronic component 401 shown in FIG. 12 includes nine electrodes 420. The nine electrodes 420 are arranged in a three-by-three grid. Each electrode 420 has a square shape.

Herein, for convenience, in FIG. 12, the electrodes 420 on the upper stage are described as an electrode 420a, an electrode 420b, and an electrode 420c in that order from the left. The electrodes 420 on the middle stage are described as an electrode 420d, an electrode 420e, and an electrode 420f in that order from the left. The electrodes 420 on the lower stage are described as an electrode 420g, an electrode 420h, and an electrode 420i in that order from the left.

In the electrode 420a, cover layers 440 extend along a first segment 421a defining a right portion of the perimeter and a third segment 423a defining a lower portion of the perimeter.

In the electrode 420a, the cover layers 440 on a first corner 425a formed by the first segment 421a and the third segment 423a are thicker than the cover layers 440 on other portions.

In the electrode 420b, the cover layers 440 extend along a first segment 421b defining a right portion of the perimeter, a second segment 422b defining a left portion of the perimeter, and a third segment 423b defining a lower portion of the perimeter.

In the electrode 420b, the cover layers 440 on a first corner 425b formed by the first segment 421b and the third segment 423b and a second corner 426b formed by the second segment 422b and the third segment 423b are thicker than the cover layers 440 on other portions.

In the electrode 420c, the cover layers 440 extend along a second segment 422c defining a left portion of the perimeter and a third segment 423c defining a lower portion of the perimeter.

In the electrode 420c, the cover layers 440 on a second corner 426c formed by the second segment 422c and the third segment 423c are thicker than the cover layers 440 on other portions.

In the electrode 420d, the cover layers 440 extend along a first segment 421d defining a right portion of the perimeter, a third segment 423d defining a lower portion of the perimeter, and a fourth segment 424d defining an upper portion of the perimeter.

In the electrode 420d, the cover layers 440 on a first corner 425d formed by the first segment 421d and the third segment 423d and a fourth corner 428d by the first segment 421d and the fourth segment 424d are thicker than the cover layers 440 on other portions.

In the electrode 420e, no cover layers are on the perimeter of the electrode.

In the electrode 420f, the cover layers 440 extend along a second segment 422f defining a left portion of the perimeter, a third segment 423f defining a lower portion of the perimeter, and a fourth segment 424f defining an upper portion of the perimeter.

In the electrode 420f, the cover layers 440 on a second corner 426f defined by the second segment 422f and the third segment 423f and a third corner 427f defined by the second segment 422f and the fourth segment 424f are thicker than the cover layers 440 on other portions.

In the electrode 420g, the cover layers 440 extend along a first segment 421g defining a right portion of the perimeter and a fourth segment 424g defining an upper portion of the perimeter.

In the electrode 420g, the cover layers 440 on a fourth corner 428g formed by the first segment 421g and the fourth segment 424g are thicker than the cover layers 440 on other portions.

In the electrode 420h, the cover layers 440 extend along a first segment 421h defining a right portion of the perimeter, a second segment 422h defining a left portion of the perimeter, and a fourth segment 424h defining an upper portion of the perimeter.

In the electrode 420h, the cover layers 440 on a fourth corner 428h formed by the first segment 421h and the fourth segment 424h and a third corner 427h by the second segment 422h and the fourth segment 424h are thicker than the cover layers 440 on other portions.

In the electrode 420i, the cover layers 440 extend along a second segment 422i defining a left portion of the perimeter and a fourth segment 424i defining an upper portion of the perimeter.

In the electrode 420i, the cover layers 440 on a third corner 427i formed by the second segment 422i and the fourth segment 424i are thicker than the cover layers 440 on other portions.

In the electronic component 401 shown in FIG. 12, the portions where the cover layers 440 are disposed are portions where stress is easily concentrated.

When the cover layers 440 are disposed as shown in FIG. 12, the stress can be dispersed in the entire electronic component 401, thus providing a structure in which the stress is uniformly distributed. This improves the mechanical strength of the electronic component 401.

No cover layers are on the perimeter of the electrode 420e. However, the stress is less likely to be concentrated because the electrode 420e is at the center of the electronic component 401. Thus, the electrode 420e is less likely to be cracked although there are no cover layers.

Second Embodiment

An electronic component according to a second embodiment of the present disclosure has the same configuration as the electronic component according to the first embodiment, except that the cover layer extends along each of the two segments forming a corner of the electrode, that the cover layer is also on an extension line of each of the two segments, and that the cover layer along one of the two segments crosses the cover layer along the other segment at the corner formed by the two segments.

Such an electronic component is described with reference to the drawings.

Figure 13:
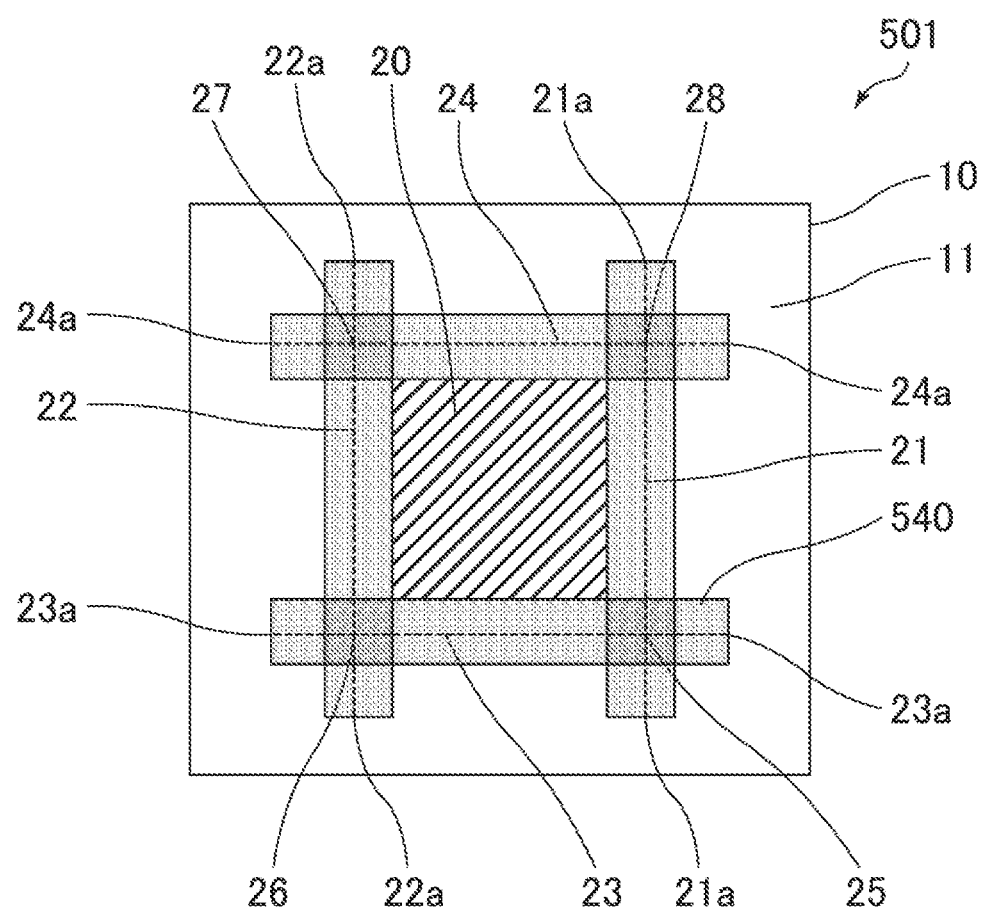
FIG. 13 is a schematic plan view of an example of an electronic component according to a second embodiment of the present disclosure.

FIG. 13 is a schematic plan view of an example of the electronic component according to the second embodiment of the present disclosure.

In an electronic component 501 shown in FIG. 13, cover layers 540 extend along the first segment 21, the second segment 22, the third segment 23, and the fourth segment 24, and the cover layers 540 are also on an extension line 21a of the first segment 21, an extension line 22a of the second segment 22, an extension line 23a of the third segment 23, and an extension line 24a of the fourth segment 24.

Further, the cover layers 540 cross each other at the first corner 25, the second corner 26, the third corner 27, and the fourth corner 28.

The electronic component 501 has the same configuration as the electronic component 1, except for these features.

The electronic component 501 has a greater adhesion surface area between the cover layers 540 and the surface 11 of the electronic component body, resulting in higher adhesion strength.

The cover layers 540 can be formed by controlling the shape of the metal mask.

Third Embodiment

An electronic component according to a third embodiment of the present disclosure has the same configuration as the electronic component according to the first embodiment, except that the cover layer extends along each of the two segments forming a corner of the electrode and that only a portion of the cover layer along one of the two segments is overlaid on the cover layer along the other segment at the corner formed by the two segments.

Such an electronic component is described with reference to the drawings.

Figure 14:
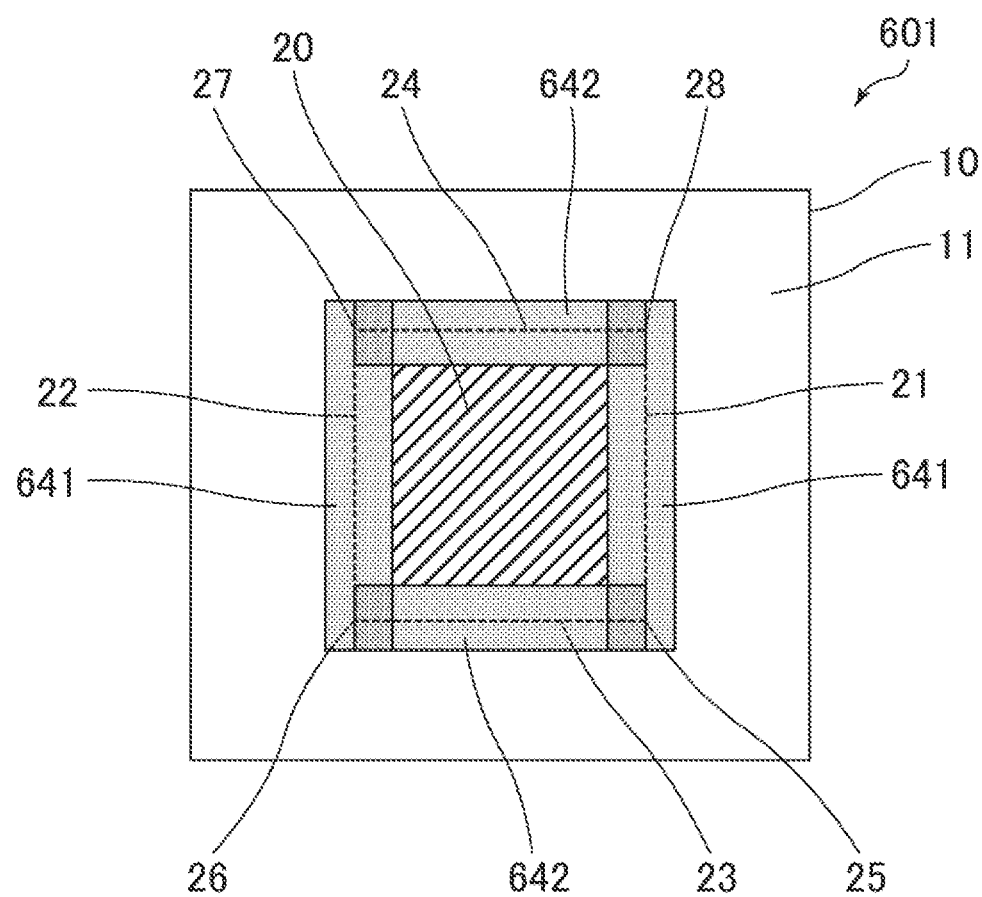
FIG. 14 is a schematic plan view of an example of an electronic component according to a third embodiment of the present disclosure.

FIG. 14 is a schematic plan view of an example of the electronic component according to the third embodiment of the present disclosure.

In an electronic component 601 shown in FIG. 14, first cover layers 641 extend along the first segment 21 and the second segment 22; and second cover layers 642 extend along the third segment 23 and the fourth segment 24.

The first cover layers 641 are longer than the second cover layers 642.

Only a portion of the first cover layer 641 is overlaid on the second cover layer 642 at each of the first corner 25, the second corner 26, the third corner 27, and the fourth corner 28. Specifically, the first cover layer 641 at each corner includes a portion that is not overlaid on the second cover layer 642.

The electronic component 601 has the same configuration as the electronic component 1, except for these features.

In the electronic component 601, the area where the cover layers are overlaid on each other is small. Thus, stress is concentrated at the portion where the cover layers are overlaid on each other during pressing in the production of the electronic component 601. Thus, the green electrode can be effectively sunk into the ceramic layer.

As a result, the electrode 20 is unlikely to be separated in the electronic component 601. Thus, the effect of reinforcing a portion where reinforcement is required is more significant in the electrode 20.

The first cover layers 641 and the second cover layers 642 can be formed using two types of metal masks having different opening lengths.

Fourth Embodiment

An electronic component according to a fourth embodiment of the present disclosure has the same configuration as the electronic component according to the first embodiment, except that the cover layer extends along each of the two segments forming a corner of the electrode and that a width of the cover layer along one of the two segments is greater than a width of the cover layer along the other segment.

Such an electronic component is described with reference to the drawings.

Figure 15:
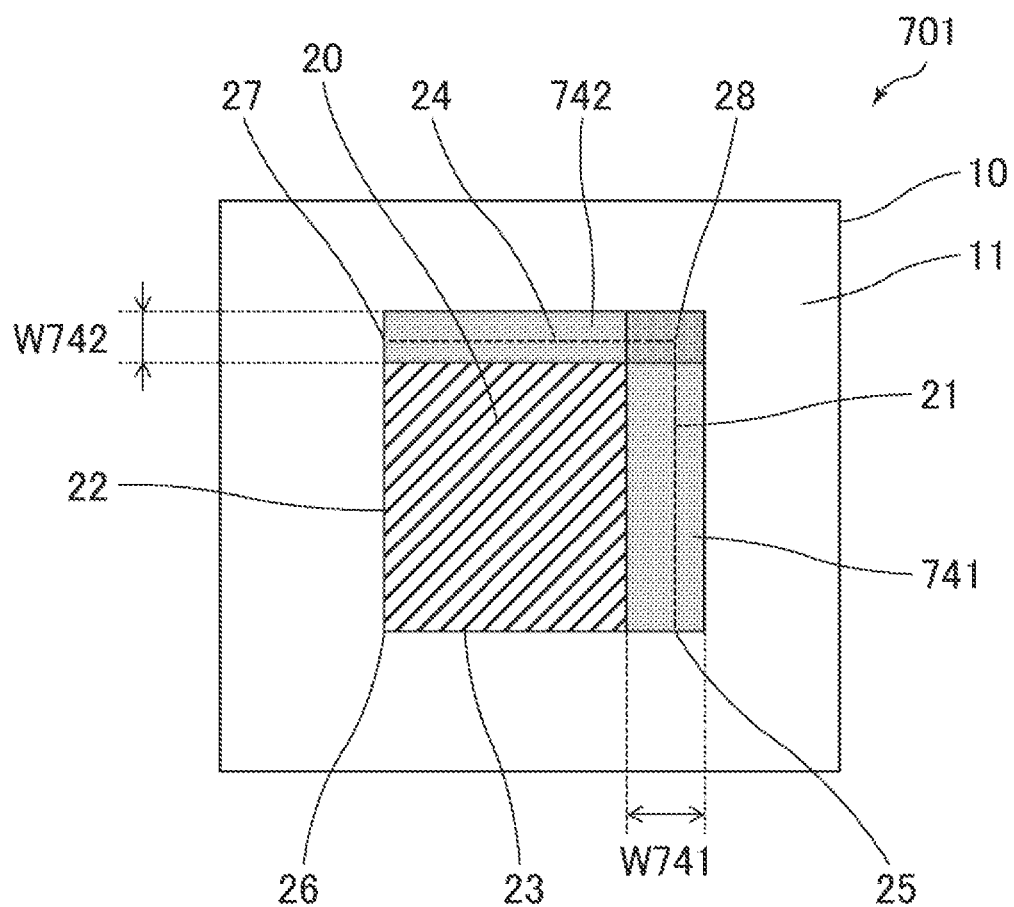
FIG. 15 is a schematic plan view of an example of an electronic component according to a fourth embodiment of the present disclosure.

FIG. 15 is a schematic plan view of an example of the electronic component according to the fourth embodiment of the present disclosure.

In an electronic component 701 shown in FIG. 15, a first cover layer 741 extends along the first segment 21; and a second cover layer 742 extends along the fourth segment 24. There are no cover layers along the second segment 22 and the third segment 23.

A width W741 of the first cover layer 741 is greater than a width W742 of the second cover layer 742.

In the electrode 20, when the first segment 21 is a portion subjected to intense stress, the stress can be dispersed by increasing the width W741 of the first cover layer 741.

The first cover layer 741 and the second cover layer 742 can be formed using two types of metal masks having different opening widths.

Fifth Embodiment

An electronic component according to a fifth embodiment of the present disclosure has the same configuration as the electronic component according to the first embodiment, except that the cover layer extends along each of the two segments forming a corner of the electrode and that a thickness of the cover layer along one of the two segments is greater than a thickness of the cover layer along the other segment.

Such an electronic component is described with reference to the drawings.

Figure 16A:
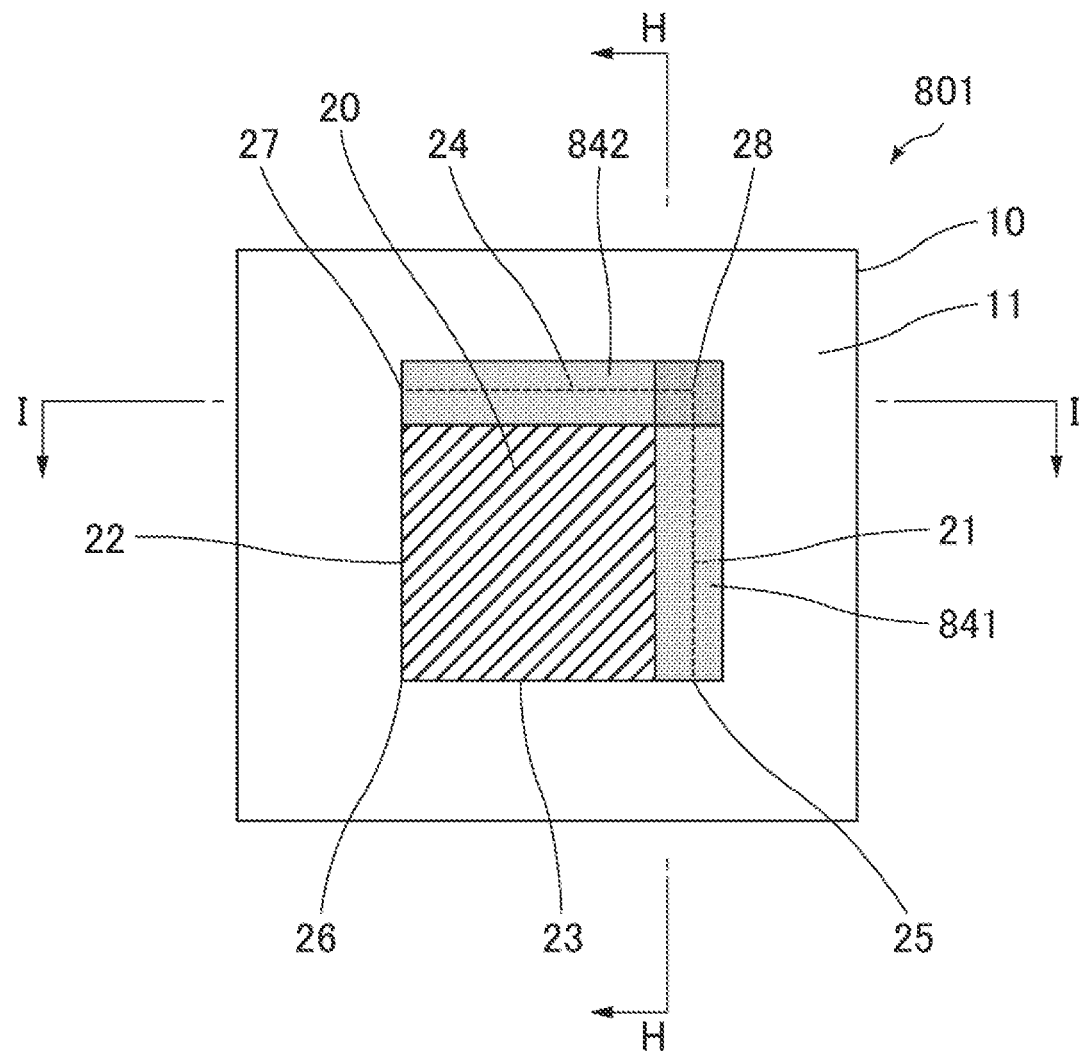
FIG. 16A is a schematic plan view of an example of an electronic component according to a fifth embodiment of the present disclosure.

FIG. 16A is a schematic plan view of an example of the electronic component according to the fifth embodiment of the present disclosure.

Figure 16B:
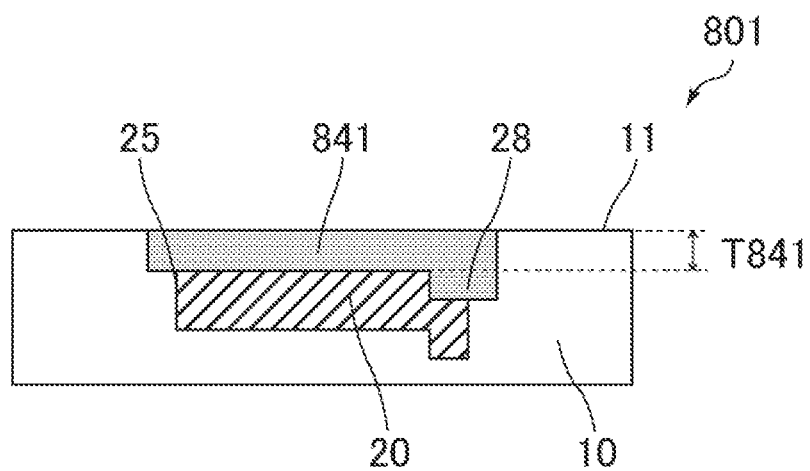
FIG. 16B is a cross-sectional view taken along line H-H in FIG. 16A.

FIG. 16B is a cross-sectional view taken along line H-H in FIG. 16A.

Figure 16C:
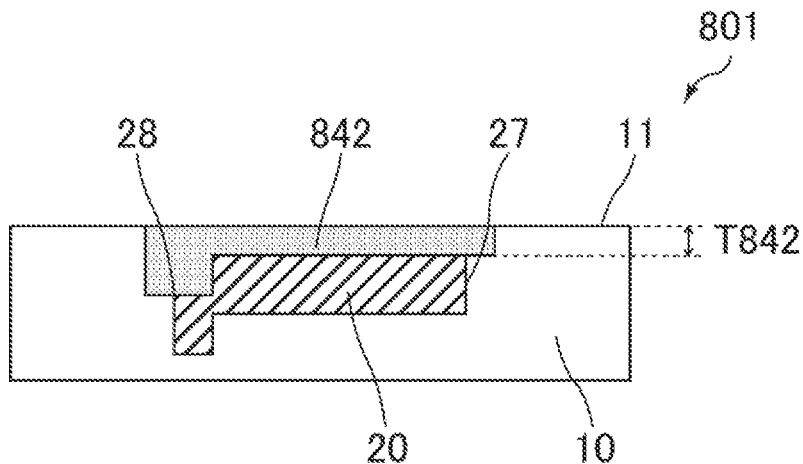
FIG. 16C is a cross-sectional view taken along line I-I in FIG. 16A.

FIG. 16C is a cross-sectional view taken along line I-I in FIG. 16A.

In an electronic component 801 shown in FIG. 16A, a first cover layer 841 extends along the first segment 21; and a second cover layer 842 extends along the fourth segment 24. No cover layers are on the second segment 22 and the third segment 23.

As shown in FIG. 16B and FIG. 16C, a thickness T841 of the first cover layer 841 is greater than a thickness T842 of the second cover layer 842.

In the electrode 20, when the first segment 21 is a portion subjected to intense stress, the stress can be dispersed by increasing the thickness T841 of the first cover layer 841. Since the cover layer on the fourth corner 28 is thicker, stress concentration on the fourth corner 28 can be further prevented.

The thickness of the first cover layer 841 and the thickness of the second cover layer 842 can be controlled by adjusting the amount of the ceramic paste for cover layers during formation of the first cover layer 841 and the second cover layer 842.

Sixth Embodiment

An electronic component according to a sixth embodiment of the present disclosure includes: an electronic component body; an electrode on a surface of the electronic component body; and a cover layer having insulating properties on at least a portion of a perimeter of the electrode and extending across a boundary between the perimeter of the electrode and the surface of the electronic component body, wherein in a plan view of the electronic component body seen from a side where the electrode is disposed, the electrode includes corners each formed by two segments defining a portion of the perimeter of the electrode, and the cover layer on a portion other than the corners includes at least a portion whose thickness is greater than a thickness of the cover layer on another portion.

Such an electronic component is described with reference to the drawings.

Figure 17A:
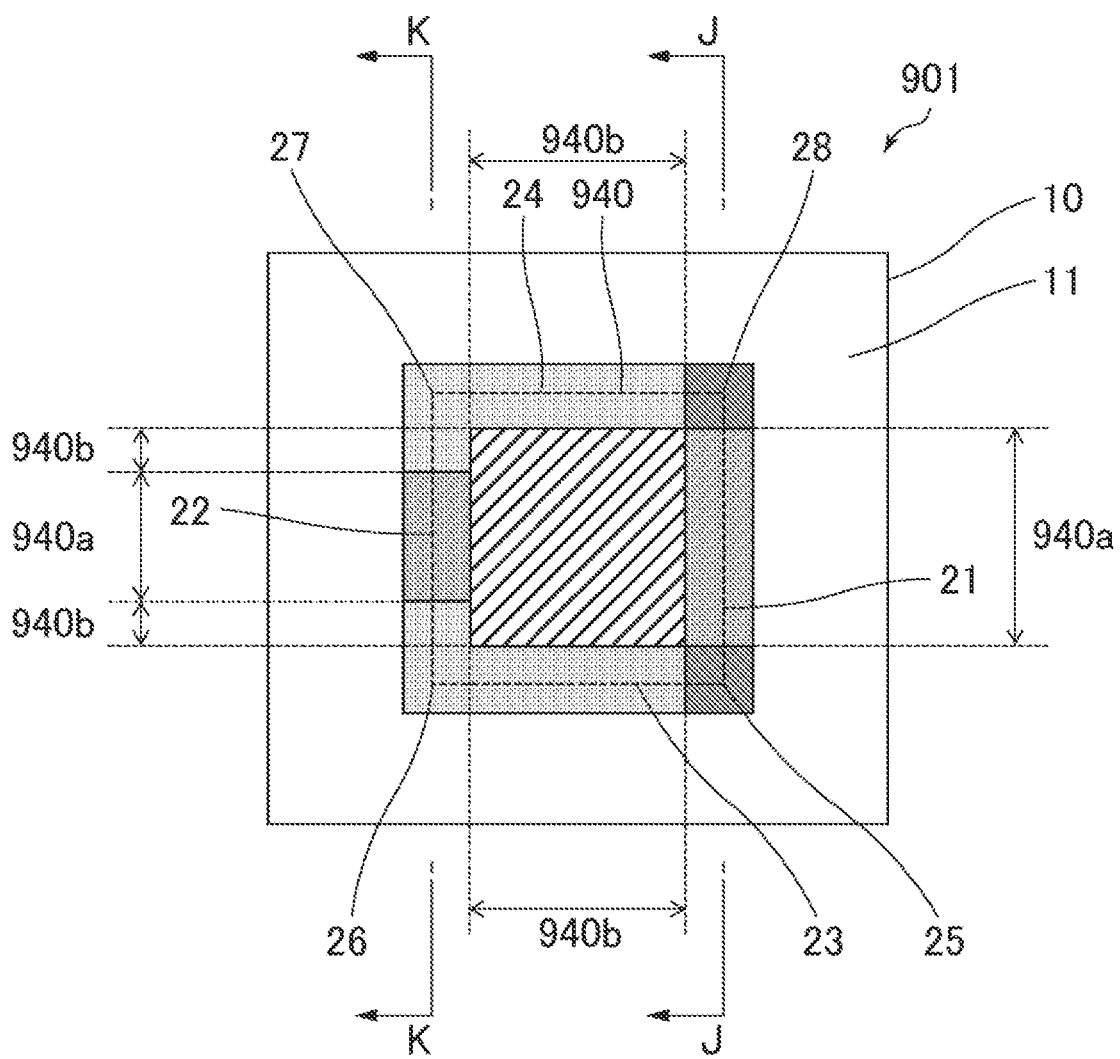
FIG. 17A is a schematic plan view of an example of an electronic component according to a sixth embodiment of the present disclosure.

FIG. 17A is a schematic plan view of an example of the electronic component according to the sixth embodiment of the present disclosure.

Figure 17B:
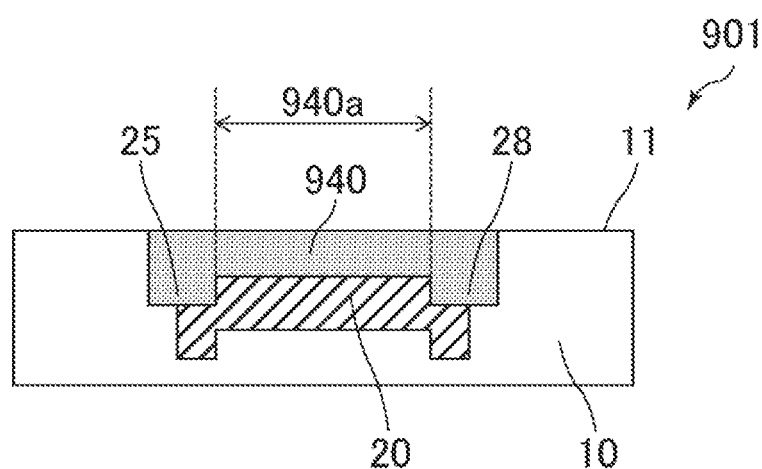
FIG. 17B is a cross-sectional view taken along line J-J in FIG. 17A.

FIG. 17B is a cross-sectional view taken along line J-J in FIG. 17A.

Figure 17C:
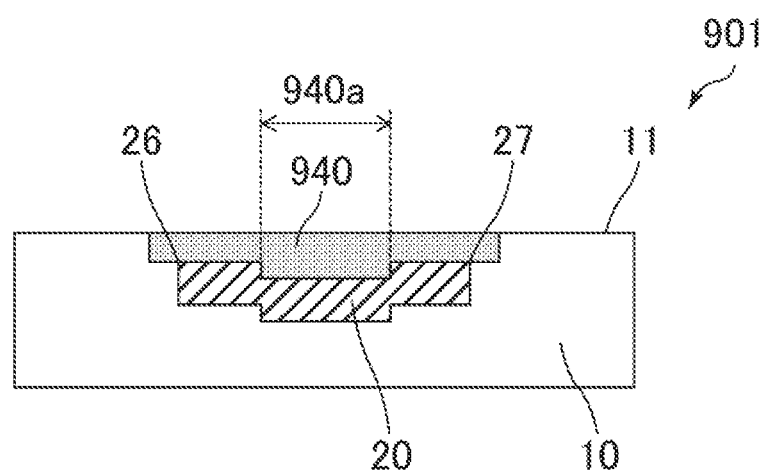
FIG. 17C is a cross-sectional view taken along line K-K in FIG. 17A.

FIG. 17C is a cross-sectional view taken along line K-K in FIG. 17A.

An electronic component 901 shown in FIG. 17A includes the electronic component body 10, the electrode 20 on the surface 11 of the electronic component body 10, and cover layers 940 having insulating properties and each extending across a boundary between the perimeter of the electrode 20 and the surface 11 of the electronic component body 10.

In a plan view of the electronic component body 10 seen from a side where the electrode 20 is disposed, the electrode 20 has a rectangular shape with a perimeter defined by the first segment 21, the second segment 22 parallel to the first segment 21, the third segment 23 perpendicular to the first segment 21, and the fourth segment 24 parallel to the third segment 23.

The electrode 20 includes the first corner 25 formed by the first segment 21 and the third segment 23; the second corner 26 formed by the second segment 22 and the third segment 23; the third corner 27 formed by the second segment 22 and the fourth segment 24; and the fourth corner 28 formed by the fourth segment 24 and the first segment 21.

In the electronic component 901, the cover layers 940 include thick layer regions 940a and thin layer regions 940b.

As shown in FIG. 17A, FIG. 17B, and FIG. 17C, the thick layer regions 940a extend along the entire first segment 21 and portions of the second segment 22.

As shown in FIG. 17A and FIG. 17C, the thin layer regions 940b extend along the entire third segment 23 and the entire fourth segment 24 as well as portions of the second segment 22 excluding a portion where the thick layer region 940a is formed.

The cover layers 940 on the first corner 25 and the fourth corner 28 are thicker than the cover layers 940 on other portions.

When the electrode 20 is locally subjected to intense stress, the relevant portion is formed as the thick layer region 940a, whereby the stress can be dispersed.

The thick layer region 940a can be formed using a metal mask having an opening that allows exposure of a portion intended to be thicker so as to increase the thickness of the cover layer 40 to be formed on the portion intended to be thicker.

1, 101, 201, 301, 302, 401, 501, 601, 701, 801, 901 electronic component
10 electronic component body
10a ceramic layer
11 surface of electronic component body
12, 112, 112', 212 hole
12a, 112a, 112a', 212a first bottom
12b, 112b, 112b', 212b second bottom
12c, 112c, 112c' third bottom
20, 20', 420, 420a, 420b, 420c, 420d, 420e, 420f, 420g, 420h, 420i electrode
20a green electrode
21, 421a, 421b, 421d, 421g, 421h first segment
21a extension line of first segment
22, 422b, 422c, 422f, 422h, 422i second segment
22a extension line of second segment
23, 423a, 423b, 423c, 423d, 423f third segment
23a extension line of third segment
24, 424d, 424f, 424g, 424h, 424i fourth segment
24a extension line of fourth segment
25, 25', 425a, 425b, 425d first corner
26, 26', 426b, 426c, 426f second corner
27, 27', 427f, 427h, 427i third corner
28, 28', 428d, 428g, 428h fourth corner
30 metal mask
31 opening
40, 40', 440, 540, 940 cover layer
50 lower ceramic layer
51 internal electrode
113, 113' slope
111a' raised portion
213a first slope
213b second slope
41, 641, 741, 841 first cover layer
42, 642, 742, 842 second cover layer
940a thick layer region
940b thin layer region

The invention claimed is:

1. An electronic component comprising:
an electronic component body;
an electrode on a surface of the electronic component body; and
a cover layer having insulating properties on at least a portion of a perimeter of the electrode and extending across a boundary between the perimeter of the electrode and the surface of the electronic component body,
wherein in a plan view of the electronic component body seen from a side where the electrode is disposed,
the electrode includes corners each provided by two segments defining a portion of the perimeter of the electrode,
the cover layer is on at least one of the corners of the electrode and on at least a portion of an edge of the electrode other than the corners, and
a thickness of at least a portion of the cover layer on the corners of the electrode is greater than a thickness of at least a portion of the cover layer on the edge of the electrode other than the corners.

2. The electronic component according to claim 1, wherein each of the corners has an angle of more than 0 degrees and not more than 90 degrees.

3. The electronic component according to claim 1, wherein the cover layer extends along each of the two segments.

4. The electronic component according to claim 3, wherein the cover layer is also on an extension line of each of the two segments, and portions of the cover layer along each one of the two segments cross each other at each of the corners provided by the two segments.

5. The electronic component according to claim 3, wherein only a portion of the cover layer along one of the two segments is overlaid on the other portions of the cover layer along the other segment at each of the corners provided by the two segments.

6. The electronic component according to claim 3, wherein a width of a portion of the cover layer along one of the two segments is greater than a width of the other portions of the cover layer along the other segment.

7. The electronic component according to claim 3, wherein a thickness of a portion of the cover layer along one of the two segments is greater than a thickness of the other portions of the cover layer along the other segment.

8. The electronic component according to claim 1, wherein
   the electrode has a rectangular shape in a plan view, and
   a thickness of at least a portion of the cover layer on each of the four corners of the rectangular shape is greater than a thickness of the other portions of the cover layer on a portion other than the corners.

9. The electronic component according to claim 1, wherein the cover layer comprises a ceramic.

10. The electronic component according to claim 2, wherein the cover layer extends along each of the two segments.

11. The electronic component according to claim 4, wherein a width of a portion of the cover layer along one of the two segments is greater than a width of the other portions of the cover layer along the other segment.

12. The electronic component according to claim 5, wherein a width of a portion of the cover layer along one of the two segments is greater than a width of the other portions of the cover layer along the other segment.

13. The electronic component according to claim 4, wherein a thickness of a portion of the cover layer along one of the two segments is greater than a thickness of the other portions of the cover layer along the other segment.

14. The electronic component according to claim 5, wherein a thickness of a portion of the cover layer along one of the two segments is greater than a thickness of the other portions of the cover layer along the other segment.

15. The electronic component according to claim 6, wherein a thickness of a portion of the cover layer along one of the two segments is greater than a thickness of the other portions of the cover layer along the other segment.

16. The electronic component according to claim 2,
   wherein the electrode has a rectangular shape in a plan view, and
   a thickness of at least a portion of the cover layer on each of the four corners of the rectangular shape is greater than a thickness of the other portions of the cover layer on a portion other than the corners.

17. The electronic component according to claim 3, wherein
   the electrode has a rectangular shape in a plan view, and
   a thickness of at least a portion of the cover layer on each of the four corners of the rectangular shape is greater than a thickness of the other portions of the cover layer on a portion other than the corners.

\* \* \* \* \*